(12) United States Patent
Komatsu et al.

(10) Patent No.: US 9,557,644 B2
(45) Date of Patent: Jan. 31, 2017

(54) BASE FILM-FORMING COMPOSITION, AND DIRECTED SELF-ASSEMBLY LITHOGRAPHY METHOD

(71) Applicant: JSR CORPORATION, Tokyo (JP)

(72) Inventors: Hiroyuki Komatsu, Tokyo (JP); Takehiko Naruoka, Tokyo (JP); Shinya Minegishi, Tokyo (JP); Kaori Sakai, Tokyo (JP); Tomoki Nagai, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 14/582,703

(22) Filed: Dec. 24, 2014

(65) Prior Publication Data

US 2015/0187581 A1 Jul. 2, 2015

(30) Foreign Application Priority Data

Dec. 26, 2013 (JP) ................................. 2013-270580
Dec. 26, 2013 (JP) ................................. 2013-270582
Dec. 19, 2014 (JP) ................................. 2014-258126

(51) Int. Cl.
*H01L 21/30* (2006.01)
*B81C 1/00* (2006.01)
(Continued)

(52) U.S. Cl.
CPC ............ *G03F 7/0388* (2013.01); *C09D 125/14* (2013.01); *C09D 133/06* (2013.01); *G03F 7/0002* (2013.01); *G03F 7/11* (2013.01)

(58) Field of Classification Search
CPC ............... H01L 21/302; H01L 21/3086; B81C 2201/0149; G03F 7/0002; G03F 7/20; G03F 7/26
See application file for complete search history.

(56) References Cited

U.S. PATENT DOCUMENTS

| | | | |
|---|---|---|---|
| 2009/0214823 A1 | 8/2009 | Cheng et al. | |
| 2011/0059299 A1* | 3/2011 | Kim ..................... | B81C 1/00031 428/195.1 |

(Continued)

FOREIGN PATENT DOCUMENTS

| | | |
|---|---|---|
| JP | 2002-519728 A | 7/2002 |
| JP | 2003-218383 A | 7/2003 |

(Continued)

*Primary Examiner* — Vu A Nguyen
(74) *Attorney, Agent, or Firm* — Oblon, McClelland, Maier & Neustadt, L.L.P.

(57) ABSTRACT

A base film-forming composition includes a compound including a group capable of reacting with Si—OH or Si—H, and a solvent. The base film-forming composition is for forming a base film provided between a layer including a silicon atom and a directed self-assembling film in a directed self-assembly lithography process. The receding contact angle of the base film for pure water is no less than 70° and no greater than 90°. The compound is preferably represented by formula (1). In the formula (1), A represents a linking group having a valency of (m+n); D represents a monovalent organic group having at least 10 carbon atoms; E represents the group capable of reacting with Si—OH or Si—H; and m and n are each independently an integer of 1 to 200.

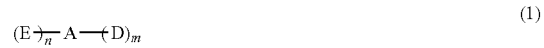

(1)

16 Claims, 2 Drawing Sheets

(51) Int. Cl.
*G03F 7/00* (2006.01)
*G03F 7/038* (2006.01)
*C09D 133/06* (2006.01)
*C09D 125/14* (2006.01)
*G03F 7/11* (2006.01)

(56) References Cited

U.S. PATENT DOCUMENTS

| | | | | |
|---|---|---|---|---|
| 2012/0080404 | A1* | 4/2012 | Lee | B81C 1/00031 216/37 |
| 2012/0116007 | A1* | 5/2012 | Gopalan | C08F 293/005 524/529 |
| 2012/0214094 | A1* | 8/2012 | Mikoshiba | H01L 21/0337 430/14 |
| 2013/0078570 | A1* | 3/2013 | Hieno | B32B 7/04 430/270.1 |
| 2013/0209755 | A1* | 8/2013 | Hustad | G03F 7/0002 428/195.1 |
| 2014/0087566 | A1* | 3/2014 | Kato | B81C 1/00031 438/761 |
| 2014/0142252 | A1* | 5/2014 | Cho | C08F 283/14 525/326.1 |

FOREIGN PATENT DOCUMENTS

| | | |
|---|---|---|
| JP | 2008-036491 A | 2/2008 |
| JP | 2008-149447 A | 7/2008 |
| JP | 2010-058403 A | 3/2010 |
| JP | 2012-174984 A | 9/2012 |
| WO | WO 00/00854 A1 | 1/2000 |

* cited by examiner

BASE FILM-FORMING COMPOSITION, AND DIRECTED SELF-ASSEMBLY LITHOGRAPHY METHOD

CROSS-REFERENCE TO RELATED APPLICATIONS

The present application claims priority to Japanese Patent Application No. 2013-270580, filed Dec. 26, 2013, to Japanese Patent Application No. 2013-270582, filed Dec. 26, 2013, and to Japanese Patent Application No. 2014-258126, filed Dec. 19, 2014. The contents of these applications are incorporated herein by reference in their entirety.

BACKGROUND OF THE INVENTION

Field of the Invention

The present invention relates to a base film-forming composition, and a directed self-assembly lithography method.

Discussion of the Background

Miniaturization of various types of electronic device structures such as semiconductor devices and liquid crystal devices has been accompanied by demands for miniaturization of patterns in lithography processes. At present, although fine resist patterns having a line width of about 90 nm can be formed using, for example, an ArF excimer laser, further finer pattern formation is required.

To meet the demands described above, a self-assembly lithography process in which a phase separation structure by directed self-assembly, as generally referred to, is utilized that spontaneously forms an ordered pattern has been proposed. As such a directed self-assembly lithography process, a method for forming an ultrafine pattern by directed self-assembly has been known in which a block copolymer is used which is obtained by copolymerizing a monomer compound having one property with a monomer compound having a property that is distinct from the one property (see Japanese Unexamined Patent Application, Publication No. 2008-149447, Japanese Unexamined Patent Application (Translation of PCT Application), Publication No. 2002-519728, and Japanese Unexamined Patent Application, Publication No. 2003-218383). According to this method, annealing of a film containing the block copolymer results in a tendency of clustering of polymer structures having the same property, and thus a pattern can be formed in a self-aligning manner. In addition, a method of forming a fine pattern by permitting directed self-assembling by using a composition that contains a plurality of polymers having properties that are different from one another has been also known (see US Patent Application, Publication No. 2009/0214823, and Japanese Unexamined Patent Application, Publication No. 2010-58403).

In such a directed self-assembly lithography process, it has been known that a phase separation through the aforementioned directed self-assembling may efficiently occur by providing on other layer, a film containing a component such as a polymer to be subjected to directed self-assembly. The layer has been diversely investigated, and it would be reportedly possible to form a variety of phase separation structures by appropriately controlling the surface free energy of the layer when directed self-assembling is allowed by using the block copolymer (Japanese Unexamined Patent Application, Publication No. 2008-36491 and see Japanese Unexamined Patent Application, Publication No. 2012-174984).

SUMMARY OF THE INVENTION

According to one aspect of the present invention, a base film-forming composition includes a compound having a group capable of reacting with Si—OH or Si—H, and a solvent. The base film forming composition is for forming a base film provided between a layer including a silicon atom and a directed self-assembling film in a directed self-assembly lithography process. The receding contact angle of the base film for pure water is no less than 70° and no greater than 90°.

According to another aspect of the present invention, a directed self-assembly lithography method includes applying the base film-forming composition on a first layer comprising a silicon atom such that a base film is provided on the first layer. A directed self-assembling film is provided on a first surface of the base film opposite to a second surface on which the first layer is provided. The directed self-assembling film includes a plurality of phases. At least a part of the plurality of phases of the directed self-assembling film is removed.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

Figure 1:
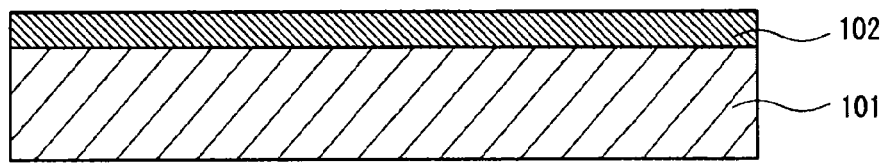
FIG. 1 shows a schematic view illustrating one example of a state after providing a base film in the directed self-assembly lithography method according to an embodiment of the present invention.

According to one embodiment of the invention made for solving the aforementioned problems, a base film-forming composition is provided which is a composition for forming a base film provided between a layer including a silicon atom (hereinafter, may be also referred to as "first layer") and a directed self-assembling film in a directed self-assembly lithography process, the composition containing a compound having a group capable of reacting with Si—OH or Si—H (hereinafter, may be also referred to as "compound (A)"), and a solvent (hereinafter, may be also referred to as "solvent (B)"), in which the receding contact angle of the base film for pure water is no less than 70° and no greater than 90°.

According to another embodiment of the invention made for solving the aforementioned problems, a directed self-assembly lithography method includes the steps of:

providing a base film with a base film-forming composition on a first layer including a silicon atom;

providing a directed self-assembling film on a face opposite to the first layer of the base film; and removing at least a part of phases of the directed self-assembling film, in which the base film-forming composition is the base film-forming composition described above.

The term "organic group" as referred to means a group that includes at least one carbon atom. The term "hydrocarbon group" may involve a chain hydrocarbon group, an alicyclic hydrocarbon group and an aromatic hydrocarbon group. The "hydrocarbon group" may be either a saturated hydrocarbon group or an unsaturated hydrocarbon group.

The "base film" in measuring the receding contact angle is formed by film formation through applying the base film-forming composition on a silicon wafer to give a coating film, and exposure with ArF light, followed by baking at 100° C. for 120 sec.

According to the base film-forming composition and the directed self-assembly lithography process of the embodiments of the present invention, a phase separation structure can be favorably formed by directed self-assembly, and formation of a rectangular pattern is enabled. Therefore, these can be suitably used for lithography processes in manufacture of various types of electronic devices such as semiconductor devices and liquid crystal devices for which further miniaturization is demanded.

The embodiments of the base film-forming composition and directed self-assembly lithography method of the present invention will now be described in detail.

Base Film-Forming Composition

The base film-forming composition according to an embodiment of the present invention is a composition for forming a base film provided between a layer including a silicon atom and a directed self-assembling film in a directed self-assembly lithography process. In brief, the base film-forming composition is used for providing a base film, which forms a directed self-assembling film, on a first layer. The base film-forming composition contains (A) a compound, and (B) a solvent. In addition, the base film-forming composition may contain as a favorable component, (C) an acid generating agent, and may further contain other optional component(s) within a range not leading to impairment of the effects of the present invention. Also, the "compound" (A) may include in addition to a polymer, an oligomer having a comparatively low molecular weight, a substance having a hydrocarbon moiety, and the like. Each component will be explained below.

(A) Compound

The compound (A) has a group capable of reacting with Si—OH or Si—H. According to the base film-forming composition, strong binding of the compound (A) to the surface of the first layer which may include Si—OH or Si—H on the surface thereof, through actions of, e.g., oxygen, water and the like in the air, is enabled due to the compound (A) having the group capable of reacting with Si—OH or Si—H. With regard to a mechanism of the advantageous effect, the following is considered to be involved. On the first layer, groups having Si—OH or Si—H are formed on the surface thereof through the actions of, for example, oxygen, water and the like in the air. Thus, the compound (A) avoids uneven distribution through aggregation of the compound molecules within the base film. Furthermore, since the receding of the base film for pure water is no less than 70° and no greater than 90°, a phase separation structure by way of directed self-assembling can be favorably formed. As a result, use of the base film-forming composition enables a phase separation structure by way of directed self-assembling and a rectangular pattern to be favorably formed.

Examples of the group capable of reacting with Si—OH or Si—H include a hydroxy group, a carboxy group, an amino group, an epoxy group (an oxiranyl group, an oxetanyl group), an alkoxy group, a group represented by the following formula (2), and the like.

$$R^B_{3-a}R^A_aSi— \qquad (2)$$

In the above formula (2), $R^A$ represents a monovalent hydrocarbon group having 1 to 20 carbon atoms; $R^B$ represents a monovalent oxyhydrocarbon group having 1 to 20 carbon atoms or a halogen atom; and a is an integer of 0 to 2, wherein in a case where $R^A$ and $R^B$ are each present in a plurality of number, a plurality of $R^A$s are each identical or different with each other, and a plurality of $R^B$s are each identical or different with each other.

The monovalent hydrocarbon group having 1 to 20 carbon atoms represented by $R^A$ is exemplified by a monovalent chain hydrocarbon group having 1 to 20 carbon atoms, a monovalent alicyclic hydrocarbon group having 3 to 20 carbon atoms, a monovalent aromatic hydrocarbon group having 6 to 20 carbon atoms, and the like.

Examples of the monovalent chain hydrocarbon group include:

alkyl groups such as a methyl group, an ethyl group, a n-propyl group, an i-propyl group, a n-butyl group, an i-butyl group, a sec-butyl group and a 1-butyl group;

alkenyl groups such as an ethenyl group, a propenyl group and a butenyl group;

alkynyl groups such as an ethynyl group, a propynyl group and a butynyl group; and the like.

Examples of the monovalent alicyclic hydrocarbon group include:

cycloalkyl groups such as a cyclopropyl group, a cyclobutyl group, a cyclopentyl group, a cyclohexyl group, a norbornyl group, an adamantyl group, a tricyclodecyl group and a tetracyclododecyl group;

cycloalkenyl groups such as a cyclopropenyl group, a cyclobutenyl group, a cyclopentenyl group, a cyclohexenyl group, a norbornenyl group and a tricyclodecenyl group; and the like.

Examples of the monovalent aromatic hydrocarbon group include:

aryl groups such as a phenyl group, a tolyl group, a xylyl group, a mesityl group, a naphthyl group and an anthryl group;

aralkyl groups such as a benzyl group, a phenethyl group, a phenylmethyl group, a naphthylmethyl group and an anthrylmethyl group; and the like.

Of these, $R^A$ represents preferably a monovalent chain hydrocarbon group, more preferably an alkyl group, and still more preferably a methyl group.

The monovalent oxyhydrocarbon group having 1 to 20 carbon atoms which may be represented by $R^B$ is exemplified by groups obtained by binding an oxygen atom to the monovalent hydrocarbon group having 1 to 20 carbon atoms exemplified in connection with $R^A$ above, and the like. Of these, groups obtained by binding an oxygen atom to the monovalent chain hydrocarbon group is preferred, an alkoxy group is more preferred, and a methoxy group is still more preferred.

Examples of the halogen atom include a fluorine atom, a chlorine atom, a bromine atom, an iodine atom, and the like. Of these, a chlorine atom is preferred.

In the above formula, a is preferably 0 or 1, and more preferably 0.

As the group capable of reacting with Si—OH or Si—H, a hydroxy group, an alkoxy group, and a group represented by the above formula (2) are preferred.

The lower limit of the receding contact angle of the base film for pure water is preferably 71°, more preferably 72°, still more preferably 73°, and particularly preferably 74°. On the other hand, the upper limit of the receding contact angle is preferably 87°, more preferably 84°, still more preferably 81°, and particularly preferably 78°. When the receding contact angle falls within the above range, the phase separation structure can be more favorably formed by directed self-assembly, and formation of a more accurately rectangular pattern tends to be enabled.

The compound (A) is preferably a compound represented by the following formula (1).

(1)

In the above formula (1), A represents a linking group having a valency of (m+n); D represents a monovalent organic group having at least 10 carbon atoms; E represents a group capable of reacting with Si—OH or Si—H; and m and n are each independently an integer of 1 to 200, wherein in a case where in is 2 or greater, a plurality of Ds are identical or different, two or more Ds optionally bond with each other; in a case where n is 2 or greater, a plurality of Es are identical or different.

The linking group having a valency of (m+n) represented by A is not particularly limited as long as it links the group represented by E with the monovalent organic group represented by D, and for example, an organic group having 1 to 30 carbon atoms, a group represented by the following formula (3), and the like are exemplified.

(3)

In the above formula (3), Q represents a polysiloxane structure having a valency of (m+n) and having 2 to 100 silicon atoms; T represents a divalent organic group having 1 to 30 carbon atoms that bonds to the silicon atom in Q at the carbon atom or oxygen atom; m and n are as defined in the above formula (1); *$^1$ denotes a site bound to E in the above formula (1); and *$^2$ denotes a site bound to D in the above formula (1).

The polysiloxane structure represented by Q is not particularly limited as long as it is a structure having a siloxane bond (—Si—O—); however, for example, a structure derived from a hydrolytic condensation product of a compound that includes a hydrolyzable silane compound represented by the following formula (5), and the like may be involved.

(5)

In the above formula (5), $R^C$ represents a hydrogen atom or a monovalent organic group; X represents a halogen atom or —$OR^D$; $R^D$ represents a monovalent organic group; and c is an integer of 0 to 3, wherein in a case where $R^C$ and X are each present in a plurality of number, a plurality of $R^C$s are identical or different, and a plurality of Xs are identical or different.

The monovalent organic group represented by $R^C$ is exemplified by a monovalent hydrocarbon group having 1 to 30 carbon atoms, a hetero atom-containing group obtained by including a hetero atom between adjacent two carbon atoms of the monovalent hydrocarbon group, a group obtained by substituting a part or all of hydrogen atoms included in the monovalent hydrocarbon group and hetero atom-containing group with a substituent, and the like.

The monovalent hydrocarbon group having 1 to 30 carbon atoms is exemplified by a monovalent chain hydrocarbon group having 1 to 30 carbon atoms, a monovalent alicyclic hydrocarbon group having 3 to 30 carbon atoms, a monovalent aromatic hydrocarbon group having 6 to 30 carbon atoms, and the like.

Examples of the monovalent chain hydrocarbon group include:
  alkyl groups such as a methyl group, an ethyl group, a n-propyl group, an i-propyl group, a n-butyl group, an i-butyl group, a sec-butyl group and a t-butyl group;
  alkenyl groups such as an ethenyl group, a propenyl group and a butenyl group;
  alkynyl groups such as an ethynyl group, a propynyl group and a butynyl group; and the like.

Examples of the monovalent alicyclic hydrocarbon group include:
  cycloalkyl groups such as a cyclopropyl group, a cyclobutyl group, a cyclopentyl group, a cyclohexyl group, a norbornyl group, an adamantyl group, a tricyclodecyl group and a tetracyclododecyl group;
  cycloalkenyl groups such as a cyclopropenyl group, a cyclobutenyl group, a cyclopentenyl group, a cyclohexenyl group, a norbornenyl group and a tricyclodecenyl group; and the like.

Examples of the monovalent aromatic hydrocarbon group include:
  aryl groups such as a phenyl group, a tolyl group, a xylyl group, a mesityl group, a naphthyl group and an anthryl group;
    aralkyl groups such as a benzyl group, a phenethyl group, a phenylmethyl group, a naphthylmethyl group and an anthrylmethyl group; and the like.

Examples of the hetero atom in the group containing a hetero atom include an oxygen atom, a nitrogen atom, a sulfur atom, a phosphorus atom, and the like.

Examples of the group containing a hetero atom include —O—, —CO—, —NR'—, —S—, —CS—, and the like, wherein R' represents a monovalent hydrocarbon group having 1 to 20 carbon atoms.

Examples of the substituent include halogen atoms such as a fluorine atom, a chlorine atom, a bromine atom and an iodine atom, as well as a hydroxy group, a carboxy group, a cyano group, a nitro group, and the like.

The monovalent organic group represented by $R^D$ is exemplified by groups similar to those exemplified as the monovalent organic group which may be represented by $R^C$, and the like.

The hydrolyzable silane compound represented by the above formula (5) is: a tetrafunctional silane when c is 0; a trifunctional silane when c is 1; a difunctional silane when c is 2; and a monofunctional silane when c is 3. In these regards, c is preferably 0 and 1, and more preferably 1.

Examples of the hydrolyzable silane compound represented by the above formula (5) include:

tetrafunctional silanes such as tetramethoxysilane and tetraethoxysilane;

trifunctional silanes such as methyltrimethoxysilane, methyltri ethoxysilane, methyltri-i-propoxysilane, methyltri-n-butoxysilane, ethyltrimethoxysilane, ethyltriethoxysilane, ethyltri-i-propoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, vinyltrimethoxysilane, vinyltriethoxysilane, 3-methacryloxypropyltrimethoxysilane, 3-methacryloxypropyltriethoxysilane, 3-acryloxypropyltrimethoxysilane, phenyltrimethoxysilane, phenyltriethoxysilane, 4-methylphenyltrimethoxysilane, 4-methylphenyltriethoxysilane, 4-t-butoxyphenethyltriethoxysilane, 1-(t-butoxyphenyl)ethyltriethoxysilane, t-butoxyphenyltriethoxysilane, p-hydroxyphenyltrimethoxysilane, 1-(p-hydroxyphenyl)ethyltrimethoxysilane, 2-(p-hydroxyphenyl)ethyltrimethoxysilane, 4-hydroxy-5-(p-hydroxyphenylcarbonyloxy)pentyltrimethoxysilane, trifluoromethyltrimethoxysilane, trifluoromethyltriethoxysilane, 3,3,3-trifluoropropyltrimethoxysilane, 3-aminopropyltrimethoxysilane, 3-aminopropyltriethoxysilane, 3-glycidoxypropyltrimethoxysilane, 3-glycidoxypropyltriethoxysilane, 2-(3,4-epoxycyclohexyl)ethyltrimethoxysilane and 3-mercaptopropyltrimethoxysilane;

difunctional silanes such as dimethyldimethoxysilane, dimethyldiethoxysilane, dimethyldiacetoxysilane, di-n-butyldimethoxysilane and diphenyldimethoxysilane;

monofunctional silanes such as trimethylmethoxysilane and tri-n-butylethoxysilane; and the like. These may be used alone, or two or more types thereof may be used in combination.

Within a range not leading to impairment of the effects of the present invention, the polysiloxane structure may be a chain structure, a two dimensional structure such as a planar structure, or a three dimensional structure such as a silsesquioxane structure.

The number of silicon atoms in Q in the above formula (3) is 2 to 100, preferably 2 to 50, and more preferably 2 to 20.

Examples of the divalent organic group represented by T having 1 to 30 carbon atoms that bonds to the silicon atom in Q at the carbon atom or oxygen atom in the above formula (3) include —$R^1$-*$^2$, —O—$R^2$-*$^2$, and the like, wherein $R^1$ and $R^2$ each independently represent a divalent organic group having 1 to 30 carbon atoms; and *$^2$ is as defined in the above formula (3).

The divalent organic group having 1 to 30 carbon atoms represented by $R^1$ and $R^2$ is exemplified by a divalent chain hydrocarbon group having 1 to 30 carbon atoms, a divalent alicyclic hydrocarbon group having 3 to 30 carbon atoms, a divalent aromatic hydrocarbon group having 6 to 30 carbon atoms, and a group that includes a hetero atom such as an oxygen atom, a nitrogen atom or a sulfur atom in the structure of the aforementioned divalent hydrocarbon group, and the like.

Examples of the divalent chain hydrocarbon group include a methanediyl group, an ethanediyl group, a n-propanediyl group, an i-propanediyl group, a n-butanediyl group, an i-butanediyl group, a n-pentanediyl group, an i-pentanediyl group, a n-hexanediyl group, an i-hexanediyl group, and the like.

Examples of the divalent alicyclic hydrocarbon group include a cyclopropanediyl group, a cyclobutanediyl group, a cyclopentanediyl group, a cyclohexanediyl group, a cyclooctanediyl group, a norbornanediyl group, an adamantanediyl group, and the like.

Examples of the divalent aromatic hydrocarbon group include a phenylene group, a naphthylene group, an anthrylene group, a toluenediyl group, a phenylethanediyl group, a xylenediyl group, and the like.

Examples of the group that includes a hetero atom in the structure of the aforementioned divalent hydrocarbon group include a 3-butoxypropan-1,2-diyl group, and the like.

The number of carbon atoms in $R^1$ and $R^2$ in the above formula (3) is 1 to 30, preferably 1 to 20, and more preferably 1 to 10.

The monovalent organic group having at least 10 carbon atoms represented by D in the above formula (1) is exemplified by the monovalent organic groups exemplified in connection with $R^C$ in the above formula (5), which have at least 10 carbon atoms, and the like.

The lower limit of the number of carbon atoms of the organic group represented by D is preferably 10, more preferably 20, still more preferably 50, and particularly preferably 100. The upper limit of the number of carbon atoms is preferably 10,000, more preferably 5,000, still more preferably 2,000, and particularly preferably 1,000.

The organic group represented by D is preferably an organic chain having a chain structure, and examples thereof include groups that include a polymeric chain having carbon-carbon bonds obtained by polymerization of a vinyl monomer or the like, oligomeric chains, hydrocarbon chains, polyalkylene oxide chains, and the like. The "polymeric chain having carbon-carbon bonds obtained by polymerization of a vinyl monomer or the like" as referred to herein means a chain constructed with carbon-carbon bonds formed by a polymerization reaction, a graft reaction and the like (hereinafter, may be also referred to as a "graft chain"). Examples of the polymeric chain include macromolecular chains, oligomer chains, and the like.

In light of ease of manufacture, D in the above formula (1) represents preferably a group that includes a polymeric chain having carbon-carbon bonds, and more preferably a group that includes a vinyl polymeric chain. Among these, in light of ease of manufacture, macromolecular chains are preferred. The structural unit constituting the polymeric chain may be either of one type or two or more types. The polymeric chain may be either linear or branched. In a case where two or more types of the structural units are included, each structural unit may be either in a random form or in a block form.

It is also preferred that D in the above formula (1) represents a group that includes a sulfur atom. In a case where D in the above formula (1) represents a group that includes a sulfur atom, it is preferred that D and A in the above formula (1) are linked via the sulfur atom.

In a case where A represents an organic group having 1 to 30 carbon atoms, and n is an integer of 1 to 10, E in the above formula (1) represents preferably a hydroxy group, or a group represented by the above formula (2), of these, in light of possible further inhibition of the uneven distribution on the first layer of the compound (A).

The compound (A) may have either one, or two or more of the group capable of reacting with Si—OH or Si—H represented by E in the above formula (1).

Furthermore, in a case where the linking group represented by A is a group represented by the above formula (3), E in the above formula (1), of these, is preferably a hydroxy group, and an alkoxy group, in light of being a group more capable of reacting with Si—OH or Si—H.

In the above formula (1), m and n are an integer of 1 to 100, preferably an integer of 1 to 50, and more preferably an integer of 1 to 20.

In a case where A in the above formula (1) represents an organic group having 1 to 30 carbon atoms, it is preferred that the compound (A) does not include a group having active hydrogen, other than the group represented by E in the above formula (1). In a case where the compound (A) includes a group having active hydrogen, other than the group represented by E in the above formula (1), the receding contact angle is likely to be lowered.

The compound (A) represented by the above formula (1) is exemplified by a compound represented by the following formula (6), and the like.

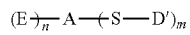
(6)

In the above formula (6), A, E, m and n are as defined in the above formula (1); and D' represents a monovalent organic group having at least 10 carbon atoms, wherein in a case where m is 2 or greater, a plurality of D's are identical or different, and two or more D's optionally bond with each other.

The monovalent organic group having at least 10 carbon atoms represented by D' is exemplified by groups similar to those exemplified as the monovalent organic group having at least 10 carbon atoms represented by D, and the like.

In a case where: the compound (A) is represented by the above formula (6); A represents an organic group having 1 to 30 carbon atoms; and D' represents an organic chain, a sulfur atom in the above formula (6) may bond either at the end of the organic chain, or at a site other than the end of the organic chain. The "end of the organic chain" here refers to an atom positioned at the end of the longest atomic chain constructing the organic chain.

In light of possible further inhibition of the uneven distribution of the compound (A) on the first layer, the compound (A) represented by the above formula (6) preferably has one group capable of reacting with Si—OH or Si—H, and it is more preferred that D' represents an organic chain, and a sulfur atom bonds to the end of the organic chain. In this instance, the compound (A) tends to be arranged in a brush form on the first layer.

The lower limit of the content of the compound (A) in the total solid content of the base film-forming composition is preferably 70% by mass, more preferably 80% by mass, and still more preferably 85% by mass. It is to be noted that the compound (A) may be used alone, or two or more types thereof may be used in combination.

Production Method of Compound (A)

In a production method of the compound (A), for example, a polymerization process, e.g., radical polymerization, radical polymerization in which a chain transfer agent is used, and living radical polymerization such as atom transfer radical polymerization (ATRP); cation polymerization, anion polymerization and the like, as well as a well-known synthesis method of an organic compound, and the like may be involved. Among these, in light of ease of manufacture, radical polymerization in which a chain transfer agent is used is preferred.

When the compound (A) is, for example, represented by the above formula (1) and D in the above formula (1) includes a sulfur atom, more specifically, when the compound (A) is represented by the above formula (6), the compound (A) is obtained through radical polymerization of, for example, a vinyl monomer in the presence of a chain transfer agent represented by the following formula (4), and the like, and may be obtained through a production method which includes the step of subjecting, for example, a vinyl monomer to radical polymerization in the presence of the chain transfer agent represented by the following formula (4).

(4)

In the above formula (4), A, E, m and n are as defined in the above formula (1).

The chain transfer agent may be synthesized in accordance with a well-known production method, or a commercially available product in the marketplace may be used.

The chain transfer agent may be obtained by, for example, a production method which includes reacting a silane compound having a mercapto group and a silane compound not having a mercapto group in the presence of an acid or a base, and the like.

Examples of the silane compound having a mercapto group include 3-mercaptopropyltrimethoxysilane, 3-mercaptopropylmethyldimethoxysilane, and the like. Of these, 3-mercaptopropyltrimethoxysilane is preferred.

Examples of the silane compound not having a mercapto group include n-butyltrimethoxysilane, methyltrimethoxysilane, dimethyldimethoxysilane, phenyltrimethoxysilane, methyltriethoxysilane, dimethyldiethoxysilane, phenyltriethoxysilane, n-hexyltrimethoxysilane, n-hexyltriethoxysilane, n-decyltrimethoxysilane, trifluoropropyltrimethoxysilane, and the like. Of these, n-butyltrimethoxysilane and methyltrimethoxysilane are preferred.

Examples of the acid include oxalic acid, hydrochloric acid, sulfuric acid, and the like. Of these, oxalic acid is preferred. Examples of the base include: alkali hydroxide such as sodium hydroxide; nitrogen-containing compounds, e.g., amine compounds such as triethylamine; and the like.

The lower limit of the polystyrene equivalent weight average molecular weight (Mw) of the chain transfer agent as determined by gel permeation chromatography (GPC) is preferably 100, more preferably 200, and still more preferably 300. The upper limit of the Mw of the chain transfer agent is preferably 20,000, more preferably 15,000, and still more preferably 10,000. When the Mw of the chain transfer agent falls within the above range, the uneven distribution of the chain transfer agent tends to be further reduced.

The lower limit of the polystyrene equivalent number average molecular weight (Mn) of the chain transfer agent as determined by gel permeation chromatography (GPC) is preferably 50, more preferably 100, and still more preferably 150. The upper limit of the Mn of the chain transfer agent is preferably 10,000, more preferably 7,500, and still more preferably 5,000, When the Mn of the chain transfer agent falls within the above range, the uneven distribution of the chain transfer agent tends to be further reduced.

The lower limit of the ratio (Mw/Mn) of the Mw to the polystyrene equivalent number average molecular weight (Mn) of the chain transfer agent as determined by GPC is preferably 1. The upper limit of the ratio Mw/Mn of the chain transfer agent is preferably 5, more preferably 4, and still more preferably 3.

As referred to herein, the weight average molecular weight (Mw) and the number average molecular weight (Mn) are determined by gel permeation chromatography (GPC) using GPC columns (Tosoh Corporation, "G2000 HXL"×2, "G3000 HXL"×1 and "G4000 HXL"×1), under analysis conditions involving a flow rate of 1.0 mL/min, an elution solvent of tetrahydrofuran, and a column temperature of 40° C., with mono-dispersed polystyrene as a standard.

Examples of the vinyl monomer, i.e., a vinyl monomer that gives the graft chain which may be represented by D in the above formula (1) include:

olefin-derived monomers such as ethylene, propylene, butene, pentene, hexene and heptene;

vinyl aromatic monomers such as styrene, vinylnaphthalene, vinylbiphenyl and α-methylstyrene;

aliphatic (meth)acrylates such as methyl (meth)acrylate, ethyl (meth)acrylate, n-propyl (meth)acrylate, i-propyl (meth)acrylate, n-butyl (meth)acrylate, i-butyl (meth)acrylate, t-butyl (meth)acrylate, 2-ethylhexyl (meth)acrylate, isooctyl (meth)acrylate, isodecyl (meth)acrylate, lauryl (meth)acrylate, stearyl (meth)acrylate and 2-acetoacetoxyethyl(meth)acrylate;

alicyclic (meth)acrylates such as cyclopropyl (meth)acrylate, cyclobutyl (meth)acrylate, cyclopentyl (meth)acrylate, cyclohexyl (meth)acrylate, dicyclopentenyl (meth)acrylate, dicyclopentanyl (meth)acrylate, norbornyl (meth)acrylate and adamantyl (meth)acrylate;

aromatic (meth)acrylates such as benzyl (meth)acrylate, phenyl (meth)acrylate and naphthyl (meth)acrylate;

halogen monomers such as vinyl fluoride, vinyl chloride, vinyl bromide, vinyl iodide, vinylidene fluoride and vinylidene chloride;

carboxylic acid monomers such as (meth)acrylic acid and maleic acid;

monomers having a polar group such as an acid anhydride group, a phosphoric acid group, a sulfonic acid group, a hydroxy group, an aldehyde group, an amino group, an amide group, an epoxy group, an acetoacetoxy group, an isocyanate group and an isothiocyanate group, and the like.

Of these, in light of more uneven distribution of the compound (A), the vinyl monomer is preferably a vinyl aromatic monomer, an aliphatic (meth)acrylate, and an aromatic (meth)acrylate, and still more preferably styrene, methyl methacrylate, cyclohexyl methacrylate, and dicyclopentanyl methacrylate.

For example, by adjusting the proportion of a polar vinyl monomer and a nonpolar vinyl monomer used, and the like, the compound (A) can be synthesized which is capable of regulating the receding contact angle of a film formed from the base film-forming composition to fall within a certain range.

Examples of the radical polymerization initiator include:

azo radical initiators such as azobisisobutyronitrile (AIBN), 2,2'-azobis(4-methoxy-2,4-dimethylvaleronitrile), 2,2'-azobis(2-cyclopropylpropionitrile), 2,2'-azobis(2,4-dimethylvaleronitrile), dimethyl 2,2'-azobisisobutyrate and 2,2'-azobis(2-methylpropionitrile);

peroxide radical initiators such as benzoyl peroxide, t-butyl hydroperoxide, cumene hydroperoxide and t-butylperoxy-2-ethylhexanoate, and the like. These may be used alone, or two or more types thereof may be used in combination.

Of these, the radical polymerization initiator is preferably 2,2'-azobis(2-methylpropionitrile), t-butylperoxy-2-ethylhexanoate, and 2,2'-azobis(2,4-dimethylvaleronitrile).

Examples of the solvent for use in the polymerization include:

alkanes such as n-pentane, n-hexane, n-heptane, n-octane, n-nonane and n-decane;

cycloalkanes such as cyclohexane, cycloheptane, cyclooctane, decalin and norbornane;

aromatic hydrocarbons such as benzene, toluene, xylene, ethylbenzene and cumene;

halogenated hydrocarbons such as chlorobutanes, bromohexanes, dichloroethanes, hexamethylene dibromide and chlorobenzene;

saturated carboxylic acid esters such as ethyl acetate, n-butyl acetate, i-butyl acetate and methyl propionate;

ketones such as acetone, methyl ethyl ketone, 4-methyl-2-pentanone and 2-heptanone;

ethers such as tetrahydrofuran, dimethoxyethanes and diethoxyethanes;

alcohols such as methanol, ethanol, 1-propanol, 2-propanol and 4-methyl-2-pentanol; and the like. These may be used alone, or two or more types thereof may be used in combination.

Of these, the solvent for use in the polymerization is preferably a ketone, and more preferably methyl ethyl ketone.

The lower limit of the reaction temperature in the polymerization is preferably 40° C., and more preferably 50° C. The upper limit of the reaction temperature is preferably 150° C., and more preferably 120° C. On the other hand, the lower limit of the reaction time period is preferably 1 hour. The upper limit of the reaction time period is preferably 48 hrs, and more preferably 24 hrs.

Taking account of handleability, it is preferred that the reaction mixture after the polymerization is diluted with a solvent such as propylene glycol monomethyl ether acetate to give a solution having a solid content concentration of no less than 5% by mass and no greater than 15% by mass.

The compound (A) represented by the above formula (1) preferably has a group that includes a polymeric chain having carbon-carbon bonds as the organic group represented by D. The group that includes a polymeric chain is exemplified by a group that includes a macromolecular chain, a group that includes an oligomer chain, and the like. Among these, a group that includes a macromolecular chain is preferred in light of further inhibition of the uneven distribution of the compound (A), and a group that includes a macromolecular chain formed from a vinyl monomer is more preferred. In other words, a graft polymer having a graft chain formed from the vinyl monomer is preferred as the compound (A).

The lower limit of the polystyrene equivalent weight average molecular weight (Mw) as determined by gel permeation chromatography (GPC) of the compound (A) is preferably 1,000, more preferably 2,000, and still more preferably 3,000. The upper limit of the Mw is preferably 50,000, more preferably 30,000, and still more preferably 20,000. When the Mw of the compound (A) falls within the above range, the uneven distribution of the compound (A) is more likely to be reduced.

The lower limit of the polystyrene equivalent number average molecular weight (Mn) of the compound (A) as determined by gel permeation chromatography (GPC) is preferably 900, more preferably 1,900, and still more preferably 2,900. The upper limit of Mn is preferably 49,000, more preferably 29,000, and still more preferably 19,000. When Mw of the compound (A) falls within the above range, the uneven distribution of the compound (A) is more likely to be reduced.

The lower limit of the ratio (Mw/Mn) of Mw to the polystyrene equivalent number average molecular weight (Mn) of the compound (A) as determined by GPC is preferably 1. The upper limit of the ratio Mw/Mn is preferably 5, more preferably 3, and still more preferably 2.5.

(B) Solvent

The base film-forming composition contains the solvent (B). The solvent (B) is exemplified by an alcohol solvent, an ether solvent, a ketone solvent, an amide solvent, an ester solvent, a hydrocarbon solvent, and the like.

Examples of the Alcohol Solvent Include:

aliphatic monohydric alcohol solvents having 1 to 18 carbon atoms such as 4-methyl-2-pentanol and n-hexanol;

alicyclic monohydric alcohol solvents having 3 to 18 carbon atoms such as cyclohexanol;

polyhydric alcohol solvents having 2 to 18 carbon atoms such as 1,2-propylene glycol;

polyhydric alcohol partially etherified solvents having 3 to 19 carbon atoms such as propylene glycol monomethyl ether, and the like.

Examples of the Ether Solvent Include:

dialkyl ether solvents such as diethyl ether, dipropyl ether, dibutyl ether, dipentyl ether, diisoamyl ether, dihexyl ether and diheptyl ether;

cyclic ether solvents such as tetrahydrofuran and tetrahydropyran;

aromatic ring-including ether solvents such as diphenyl ether and anisole; and the like.

Examples of the Ketone Solvent Include:

chain ketone solvents such as acetone, methyl ethyl ketone, methyl n-propyl ketone, methyl n-butyl ketone, diethyl ketone, methyl iso-butyl ketone, 2-heptanone, ethyl n-butyl ketone, methyl n-hexyl ketone, di-iso-butyl ketone and trimethylnonanone;

cyclic ketone solvents such as cyclopentanone, cyclohexanone, cycloheptanone, cyclooctanone and methylcyclohexanone:

2,4-pentanedione, acetonylacetone, acetophenone; and the like.

Examples of the Amide Solvent Include cyclic amide solvents such as N,N'-dimethylimidazolidinone and N-methylpyrrolidone;

chain amide solvents such as N-methylformamide, N,N-dimethylformamide, N,N-diethylformamide, acetamide, N-methylacetamide, N,N-dimethylacetamide and N-methylpropionamide; and the like.

Examples of the Ester Solvent Include:

monocarboxylic acid ester solvents such as butyl acetate, ethyl lactate and butoxymethyl acetate;

polyhydric alcohol carboxylate solvents such as propylene glycol acetate;

polyhydric alcohol partially etherified carboxylate solvents such as propylene glycol monomethyl ether acetate;

polyhydric carboxylic acid ester solvents such as diethyl oxalate;

carbonate solvents such as dimethyl carbonate and diethyl carbonate; and the like.

Examples of the hydrocarbon solvent include:

aliphatic hydrocarbon solvents having 5 to 12 carbon atoms such as n-pentane and n-hexane;

aromatic hydrocarbon solvents having 6 to 16 carbon atoms such as toluene and xylene; and the like.

These may be used alone, or two or more types thereof may be used in combination.

Among these, the solvent (B) is preferably an alcohol solvent, an ester solvent, and a ketone solvent, more preferably a polyhydric alcohol partially etherified solvent having 3 to 19 carbon atoms, a monocarboxylic acid ester solvent, and a cyclic ketone solvent, and still more preferably propylene glycol monomethyl ether acetate, butoxymethyl acetate, butyl acetate, and cyclohexanone.

The lower limit of the content of the solvent (B) with respect to 100 parts by mass of the compound (A) is preferably 500 parts by mass, more preferably 1,000 parts by mass, and still more preferably 2,000 parts by mass. On the other hand, the upper limit of the content of the solvent (B) with respect to 100 parts by mass of the compound (A) is preferably 50,000 parts by mass, more preferably 30,000 parts by mass, and still more preferably 20,000 parts by mass. When the content of the solvent (B) falls within the above range, further dispersion of the compound (A) in the solvent (B) is enabled.

(C) Acid Generating Agent

The acid generating agent (C) is a component that generates an acid upon an exposure or heating. Through containing the acid generating agent (C), the base film-forming composition enables a reaction of the compound (A) with Si—OH or Si—H to be accelerated. As a result, the uneven distribution of the compound (A) can be further inhibited, the phase separation structure can be more favorably formed by directed self-assembly, and thus formation of a more accurately rectangular pattern is enabled.

Examples of the acid generating agent (C) include:

sulfonium salts such as triphenylsulfonium trifluoromethanesulfonate, triphenylsulfonium 2-(adamantan-1-ylcarbonyloxy)-1,1,3,3,3-pentafluoropropane-1-sulfonate, triphenylsulfonium norbornanesulton-2-yloxycarbonyldifluoromethanesulfonate, triphenylsulfonium piperidin-1-ylsulfonyl-1,1,2,2,3,3-hexafluoropropane-1-sulfonate, triphenylsulfonium adamantan-1-yloxycarbonyldifluoromethanesulfonate, 4-cyclohexylphenyldiphenylsulfonium camphorsulfonate, 4-methanesulfonylphenyldiphenylsulfonium nonafluoro-n-butanesulfonate and triphenylsulfonium 2-(bicyclo[2.2.1]hept-2-yl)-1,1,2,2-tetrafluoroethane-1-sulfonate;

tetrahydrothiophenium salts such as 1-(4-n-butoxynaphthalen-1-yl)tetrahydrothiophenium trifluoromethanesulfonate, 1-(6-n-butoxynaphthalen-1-yl)tetrahydrothiophenium 2-bicyclo[2.2.1]hept-2-yl-1,1,2,2-tetrafluoroethane-1-sultanate and 1-(3,5-dimethyl-4-hydroxyphenyl)tetrahydrothiophenium camphorsulfonate;

N-sulfonyloxyimide compounds such as N-(trifluoromethanesulfonyloxy)bicyclo[2.2.1]hept-5-ene-2,3-dicarboxyimide and N-(camphorsulfonyloxy)bicyclo[2.2.1]hept-5-ene-2,3-dicarboxyimide;

iodonium salts such as diphenyliodonium trifluoromethanesulfonate, bis(4-t-butylphenyl)iodonium trifluoromethanesulfonate, bis(4-t-butylphenyl)iodonium nonafluoro-n-butanesulfonate and 4-methoxyphenylphenyliodonium camphorsulfonate; and the like.

These may be used alone, or two or more types thereof may be used in combination.

As the anion species which may be included in the acid generating agent (C), a fluorinated sulfonic acid anion is preferred.

As the cation species which may be included in the acid generating agent (C), a sulfonium cation and an iodonium cation are preferred.

The acid generating agent (C) is preferably a sulfonium salt, and an iodonium salt.

When the base film-forming composition contains the acid generating agent (C), the lower limit of the content of the acid generating agent (C) with respect to 100 parts by mass of the compound (A) is preferably 0.1 parts by mass, and more preferably 0.5 parts by mass. On the other hand, the upper limit of the content of the acid generating agent (C) with respect to 100 parts by mass of the compound (A) is preferably 30 parts by mass, and more preferably 20 parts by mass. When the content of the acid generating agent (C) falls within the above range, the uneven distribution of the compound (A) can be further inhibited, and consequently the phase separation structure can be more favorably formed by directed self-assembly, and thus formation of a more accurately rectangular pattern is enabled.

Other Optional Components

The base film-forming composition may contain other optional component(s) in addition to the components described above. The other optional component is exemplified by a surfactant, and the like.

Surfactant

The surfactant is a component capable of improving application properties onto the first layer such as a substrate. The upper limit of the content of the surfactant with respect to 100 parts by mass of the compound (A) is preferably 2 parts by mass, and more preferably 1.5 parts by mass.

Preparation Method of Base Film-Forming Composition

The base film-forming composition may be prepared by mixing, for example, the compound (A), the solvent (B), and as needed the acid generating agent (C), etc., at a certain ratio. Moreover, the lower limit of the solid content concentration of the base film-forming composition is preferably 0.01% by mass, and more preferably 0.1% by mass. The upper limit of the solid content concentration is preferably 30% by mass, and more preferably 10% by mass.

Directed Self-Assembly Lithography Method

The directed self-assembly as referred to means a phenomenon of spontaneously constructing a tissue or structure without resulting from only the control from an external factor. A film having a phase separation structure by directed self-assembly (i.e., directed self-assembling film) is formed by coating, for example, a directed self-assembling composition or the like on a specific base, and a part of phases in the directed self-assembling film are removed, thereby enabling a directed self-assembling pattern to be formed.

The directed self-assembly lithography method includes the steps of, for example: providing a base film with a base film-forming composition on a first layer including a silicon atom (hereinafter, may be also referred to as "base film-forming step"); providing a directed self-assembling film on a face opposite to the first layer of the base film (hereinafter, may be also referred to as "directed self-assembling film-forming step"); and removing at least a part of phases of the directed self-assembling film (hereinafter, may be also referred to as "removing step"), in which the base film-forming composition is the base film-forming composition described above.

The directed self-assembly lithography method may include forming a prepattern on a face opposite to the first layer of the base film, for example, on the first layer having the base film formed thereon by using the prepattern-forming composition (hereinafter, may be also referred to as "prepattern-forming step") between the base film-forming step and the directed self-assembling film-forming step, i.e., after providing the base film and before providing the directed self-assembling film.

The directed self-assembly lithography method may include the step of patterning the first layer (hereinafter, may be also referred to as "first layer-patterning step") after the removing step. Each step first layer will be explained below in regard to the case in which the first layer is a substrate with reference to FIGS. 1 to 5.

Base Film-Forming Step

According to this step, a base film is provided on a substrate 101 by using the base film-forming composition. Through carrying out this step, as shown in FIG. 1, the substrate 101 provided with a base film 102, i.e., the substrate 101 having a base film formed thereon is obtained. A directed self-assembling film 105 is formed on the base film 102 so as to be overlaid. In the directed self-assembling film 105, control of the structure is enabled as a result of providing the base film on the substrate 101 in forming the phase separation structure (microdomain structure); therefore, the phase separation structure by directed self-assembly can be conveniently and favorably formed, thereby enabling a rectangular pattern and the like to be formed.

The substrate 101 for use in the directed self-lithography method is not particularly limited as long as a silicon atom is included; and is exemplified by a silicon atom-containing substrate such as a silicon wafer, a metal substrate having a siloxane film formed thereon, and the like. Among these, the silicon atom-containing substrate is preferred, and the silicon wafer is more preferred. It is to be noted that the substrate 101 includes Si—OH or Si—H on the surface thereof, in general, due to the actions of oxygen, water and the like in the air. Alternatively, the substrate 101 can also include Si—OH or Si—H on the surface thereof through a surface treatment with an acid such as sulfuric acid.

Although the base film-forming method is not particularly limited, the base film may be provided through, for example, coating the base film-forming composition by a well-known method such as a spin coating method on the substrate 101 to give a coating film, followed by heating or exposure to permit curing. Examples of the radioactive ray which may be employed for the exposure include visible light rays, ultraviolet rays, far ultraviolet rays, X-rays, electron beams, γ-rays, molecular beams, ion beams, and the like.

The lower limit of the temperature in heating the coating film is preferably 100° C., and more preferably 120° C. The upper limit of the temperature is preferably 400° C., and more preferably 350° C. The lower limit of the time period of the heating of the coating film is preferably 10 sec, and more preferably 30 sec. The upper limit of the time period of the heating is preferably 600 sec, and more preferably 300 sec. When the heating temperature and the time period in forming the base film fall within the above range, the uneven distribution of the compound (A) can be further inhibited. Although the atmosphere employed in heating the coating film is not particularly limited, either an air atmosphere, or an inert gas atmosphere such as a nitrogen gas atmosphere is acceptable. In addition, the coating film may be washed with a solvent after heating.

The lower limit of the average film thickness of the base film 102 is preferably 0.5 nm, more preferably 1 nm, and still more preferably 5 nm. The upper limit of the average film thickness is preferably 2,000 nm, more preferably 100 nm, and still more preferably 50 nm.

Prepattern-Forming Step

Figure 2:
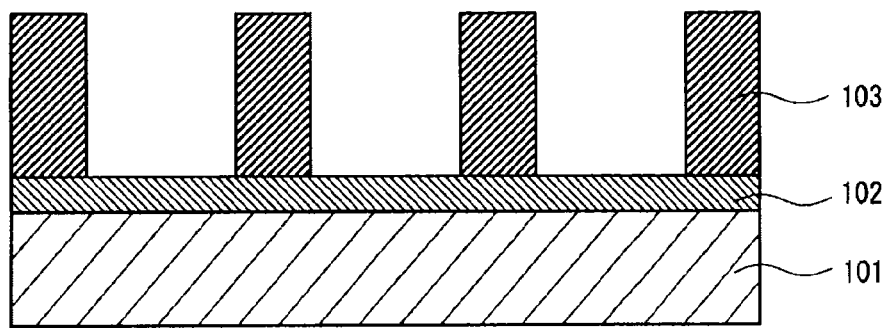
FIG. 2 shows a schematic view illustrating one example of a state after forming a prepattern on the base film in the directed self-assembly lithography method according to the embodiment of the present invention.

According to this step, as shown in FIG. 2, a prepattern 103 is formed on the base film 102 by using the prepattern-forming composition. By carrying out this step, the phase separation in providing the directed self-assembling film 105 is further controlled, whereby a phase separation structure can be more favorably formed by directed self-assembly. More specifically, among the components that form the directed self-assembling film 105, and the like, the components, etc., having a higher affinity to lateral faces of the prepattern 103 form the phases along the prepattern, whereas components, etc., having a lower affinity form the phases at positions away from the prepattern 103. Accordingly, a phase separation structure by directed self-assembly can be more favorably formed. In addition, according to the material, length, thickness, shape, etc., of the prepattern 103, the phase separation structure formed can be finely controlled. Furthermore, the prepattern 103 may be partially modified through partial exposure, laser ablation or the like. It is to be noted that the prepattern 103 may be appropriately selected depending on the pattern intended to be finally formed, and for example, a line-and-space pattern, a hole pattern, a pillar pattern and the like may be employed.

As the method for forming the prepattern 103, those similar to well-known resist pattern-forming methods may be used. In addition, a conventional composition for forming a resist film may be used as the composition for prepattern formation. In a specific method for forming the prepattern 103, for example, a chemical amplification resist composition such as ARX 2928JN" available from JSR Corporation is used to provide a resist film on the base film 102 by coating. Next, an exposure is carried out by irradiating a desired region of the resist film with a radioactive ray through a mask of a specific pattern. Examples of the radioactive ray include far ultraviolet rays such as ArF excimer laser beams and KrF excimer laser beams, ultraviolet rays, electromagnetic waves such as X-rays, electron beams such as charged particle rays, and the like. Of these, far ultraviolet rays are preferred, ArF excimer laser beams and KrF excimer laser beams are more preferred, and ArF excimer laser beams are still more preferred. Subsequently, post exposure baking (PEB) is carried out, followed by development using a developer solution such as an alkaline developer solution, whereby a desired prepattern 103 can be formed.

It is to be noted that the surface of the prepattern 103 may be subjected to a hydrophobilization treatment or a hydrophilization treatment. In specific treatment methods, a hydrogenation treatment including exposing to hydrogen plasma for a certain time period, and the like may be adopted. An increase of the hydrophobicity or hydrophilicity of the surface of the prepattern 103 enables the directed self-assembly described above to be accelerated.

Directed Self-Assembling Film-Forming Step

Figure 3:
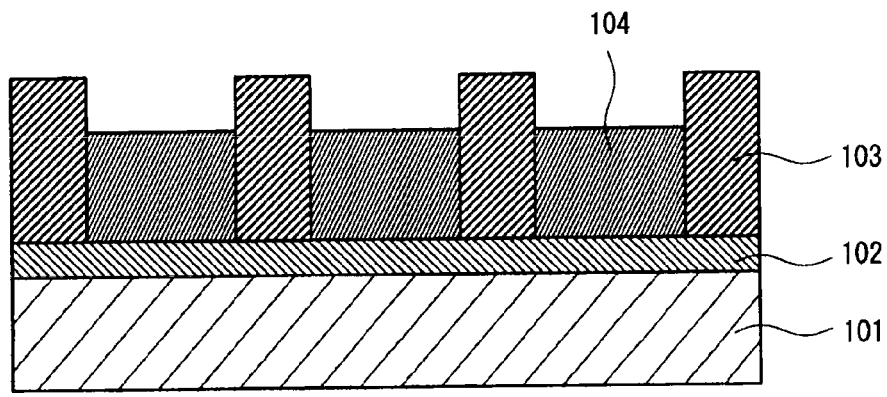
FIG. 3 shows a schematic view illustrating one example of a state after coating a directed self-assembling composition on a region surrounded by the prepattern on the base film in the directed self-assembly lithography method according to the embodiment of the present invention.
Figure 4:
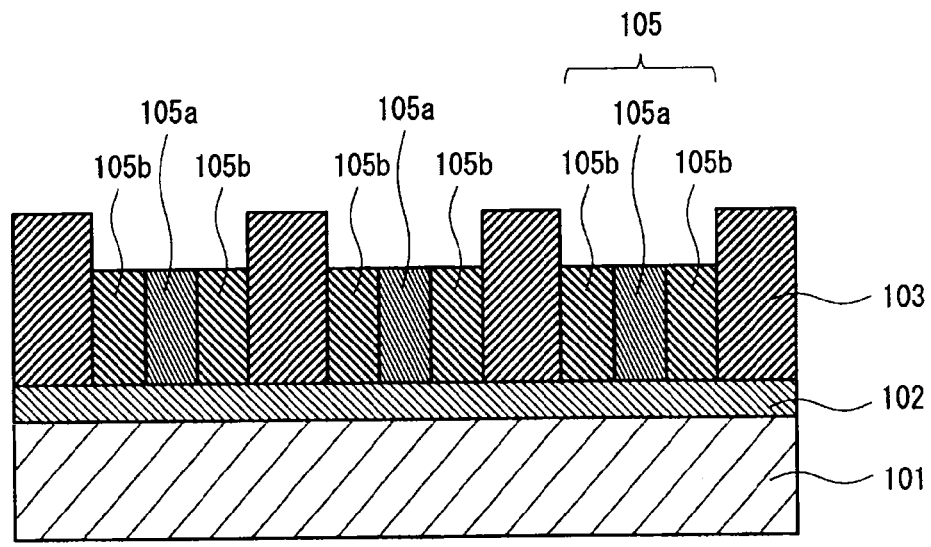
FIG. 4 shows a schematic view illustrating one example of a state after providing a film having a phase separation structure by directed self-assembly on a region surrounded by the prepattern on the base film in the directed self-assembly lithography method according to the embodiment of the present invention.

In this step, the directed self-assembling film 105 is provided on the base film 102. By carrying out this step, a substrate can be obtained that includes the directed self-assembling film 105 formed on the base film 102. The formation of the directed self-assembling film 105 may be executed, for example, through: coating a directed self-assembling composition containing a component capable of forming a phase separation structure by directed self-assembly, or the like on the base film 102 to provide a coating film; and allowing directed self-assembling of the components in the coating film, and the like. In addition, when the prepattern 103 is used, as shown in FIG. 3, the directed self-assembling composition is coated on a region in which the prepattern 103 is not formed, i.e., a region surrounded by the prepattern 103 on the base film 102 to provide a coating film, whereby the directed self-assembling film 105 having a phase separation structure is formed as shown in FIG. 4.

In providing the directed self-assembling film 105, the directed self-assembling composition is coated on the base film 102 to provide a coating film, followed by annealing and the like allows portions having identical properties to be assembled with one another to spontaneously form an ordered pattern, and thus enables directed self-assembling, as generally referred to, to be accelerated. Accordingly, a directed self-assembling film 105 having a phase separation structure on the base film 102 is formed. The phase separation structure is preferably formed along the prepattern 103, and the interface formed by the phase separation is preferably substantially parallel to the lateral face of the prepattern 103. For example, in a case in which the prepattern 103 is a line pattern, the phases (105b) of the components, etc., having a higher affinity to the prepattern 103 are formed along the prepattern 103, whereas the phases (105a) of other components, etc., are formed at a portion most away from the lateral face of prepattern 103, i.e., at a center portion of the region surrounded by the prepattern 103, leading to formation of a lamellar phase separation structure in which lamellar (platy) phases are alternately arranged. In a case in which the prepattern 103 is a hole pattern, the phases of the components, etc., having a higher affinity to the prepattern 103 are formed along the lateral face of the holes of the prepattern 103, whereas the phases of other components, etc., are formed at a center portion of the holes. Alternatively, in a case in which the prepattern 103 is a pillar pattern, the phases of the components, etc., having a higher affinity to the prepattern 103 are formed along the lateral face of the pillars of the prepattern 103, whereas the phases of other components, etc., are formed at a portion most away from each pillar. A desired phase separation structure can be formed by appropriately adjusting the distance between the pillars of the prepattern 103, the structure of the components such as each polymer in the directed self-assembling composition, blend proportion, and the like. It is to be noted that the phase separation structure formed in this step is configured with a plurality of phases, and the interface formed by these phases is substantially perpendicular, in general; however, the interface per se may not necessarily be clear. Accordingly, a further desired fine pattern can be obtained through strictly controlling the resultant phase separation structure depending on the structure and the blend proportion of the components of each compound, and the prepattern 103, in addition to the base film 102.

The component capable of forming a phase separation structure by directed self-assembly is not particularly limited as long as the component has the properties as described above, and for example, a block copolymer, a mixture of two or more types of polymers that are incompatible with one another, and the like may be involved. Among these, in light of a possibility of more favorably forming the phase separation structure, a block copolymer is preferred, a block copolymer composed of a styrene unit and a methacrylate ester unit is more preferred, and a diblock copolymer composed of a styrene unit and a methyl methacrylate unit is still more preferred.

Although the procedure for providing a coating film 104 by coating the directed self-assembling composition on the substrate is not particularly limited, for example, a procedure in which the directed self-assembling composition employed is coated by spin coating or the like, and the like may be involved. Accordingly, the directed self-assembling composition is coated between the prepatterns 103 and the like on the base film 102 to form the coating film 104.

The annealing process may include, for example, heating at a temperature of preferably no less than 80° C. and no greater than 400° C., and more preferably no less than 80° C. and no greater than 300° C. in an oven, on a hot plate, etc., and the like. The lower limit of the annealing time period is preferably 10 sec, and more preferably 30 sec. The upper limit of the annealing time period is preferably 120 min, and more preferably 60 min. The lower limit of the average film thickness of the directed self-assembling film 105 thereby obtained is preferably 0.1 nm, and more preferably 0.5 nm.

The upper limit of the average film thickness is preferably 500 nm, and more preferably 100 nm.

Removing Step

Figure 5:
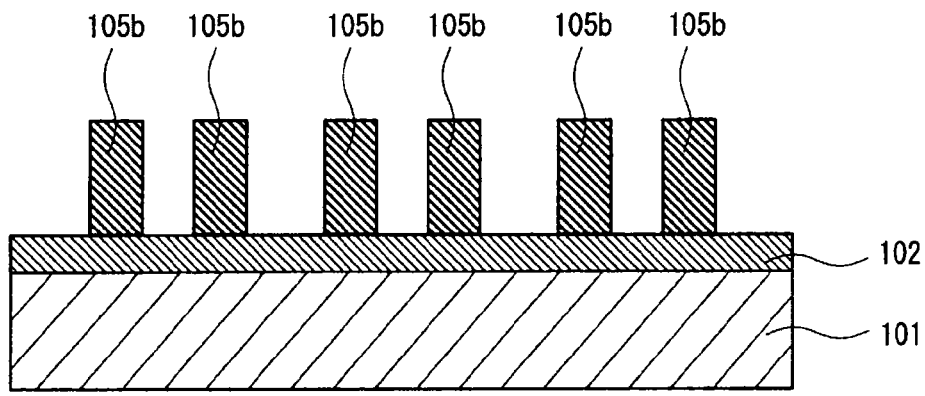
FIG. 5 shows a schematic view illustrating one example of a state after removing a part of phases of the directed self-assembling film and the prepattern in the directed self-assembly lithography method according to the embodiment of the present invention.

In this step, as shown in FIGS. 4 and 5, at least a part of the phases of the directed self-assembling film 105 is removed. By carrying out this step, phases 105a, i.e., a part of phases of the phase separation structure included in the directed self-assembling film 105 can be removed. The part of the phases can be removed with an etching treatment by making use of the difference in the etching rate, etc., of each phase generated by phase separation by way of the directed self-assembly. In this step, the prepattern 103 may be similarly or separately removed. A state after removing the part of the phases 105a of the phase separation structure, and the prepattern 103 is shown in FIG. 5.

As the procedure for removing the prepattern 103 or the part of the phases 105a of the phase separation structure included in the directed self-assembling film 105, well-known procedures e.g., reactive ion etching (RIE) such as chemical dry etching and chemical wet etching; physical etching such as sputter etching and ion beam etching, and the like may be exemplified. Of these, reactive ion etching (RIE) is preferred, and chemical dry etching carried out by using $CF_4$, $O_2$ gas or the like, and chemical wet etching (wet development) carried out by using an etching solution, a liquid such as an organic solvent such as methyl isobutyl ketone (MIBK) or 2-propanol (IPA), and hydrofluoric acid, are more preferred.

First Layer-Patterning Step (Substrate-Patterning Step)

In this step, a substrate pattern is formed. By carrying out this step, using the pattern configured with the part of the phases 105b of the residual phase separation film as a mask, the base film 102 and the substrate are etched to permit patterning. After completion of the patterning onto the substrate, the phases used as a mask are removed from the substrate by a dissolving treatment or the like, whereby a patterned substrate (pattern) can be finally obtained. The resultant pattern is exemplified by a line-and-space pattern, a hole pattern, and the like. As the procedure for the etching, the procedure similar to those in the removing step may be employed, and the etching gas and the etching solution may be appropriately selected according to the materials of the base film 102 and the substrate. For example, in a case in which the substrate is a silicon material, a gas mixture of chlorofluorocarbon-containing gas and $SF_4$, or the like may be used. Also, in a case in which the substrate is a metal film, a gas mixture of $BCl_3$ and $Cl_2$, or the like may be used. The pattern obtained according to the directed self-assembly lithography method is suitably used for semiconductor elements and the like, and further the semiconductor elements are widely used for LED, solar cells and the like.

The embodiment has been explained by referring to the case in which the first layer is a substrate, by way of illustration; however, the first layer is not particularly limited, and for example, the first layer employed may be a layer including a silicon atom provided on a substrate.

Also, in this embodiment, the film having a phase separation structure is formed through annealing; however, the procedure for providing the directed self-assembling film is not particularly limited, and for example, a spontaneous formation procedure may be involved which does not rely only on the control from an external factor.

Examples

Hereinafter, the present invention is explained in detail by way of Examples, but the present invention is not in any way limited by Examples. Measuring methods for various types of physical properties are shown below.

Weight Average Molecular Weight (Mw) and Number Average Molecular Weight (Mn)

The Mw and the Mn of the polymer were determined by gel permeation chromatography (GPC) using GPC columns (Tosoh Corporation, "G2000 HXL"×2, "G3000 HXL"×1 and "G4000 HXL"×1) under the analytical condition involving a flow rate of 1.0 mL/min, an elution solvent of tetrahydrofuran and a column temperature of 40° C., with mono-dispersed polystyrene as a standard.

$^{13}$C-NMR Analysis

The $^{13}$C-NMR analysis was carried out using "JNM-EX400" available from JEOL, Ltd., with DMSO-$d_6$ for use as a solvent for measurement. The proportion of each structural unit included was calculated from each area ratio of the peak corresponding to each structural unit on the spectrum obtained by the $^{13}$C-NMR Analysis.

Production of Compound, Chain Transfer Agent and Polymer

Production methods of the chain transfer agent, the compound and the polymer used in Examples and Comparative Examples are shown in the following.

Synthesis Example 1

Production of Compound (A-1)

To a flask equipped with a condenser and a stirrer was charged 100 g of methyl ethyl ketone, and the interior of the flask was purged with nitrogen. After the flask was heated to 85° C., a mixed solution containing 100 g of methyl ethyl ketone, 51 g (0.49 mol) of styrene, 49 g (0.49 mol) of methyl methacrylate and 3 g (0.027 mol) of mercapto-1,2-propanediol, and a mixed solution containing 3 g of 2,2'-azobis(2,4-dimethylvaleronitrile) as a radical polymerization initiator and 100 g of methyl ethyl ketone were added dropwise, respectively, over 3 hrs at the same temperature, and the polymerization was allowed while maintaining this temperature for 3 hrs. The compound solution thus obtained was subjected to precipitation and purification with 3 L of methanol to eliminate residual monomers, the radical polymerization initiator and the like, and then propylene glycol monomethyl ether acetate was added to the product to obtain a solution containing 10% by mass of the compound (A-1). The compound (A-1) had the Mw of 7,285, the Mn of 5,465, and the Mw/Mn of 1.33.

Synthesis Example 2

Production of Compound (A-2)

To a flask equipped with a condenser and a stirrer was charged 100 g of methyl ethyl ketone, and the interior of the flask was purged with nitrogen. After the flask was heated to 85° C., a mixed solution containing 100 g of methyl ethyl ketone, 46 g (0.442 mol) of styrene, 49 g (0.489 mol) of methyl methacrylate, 5 g (0.035 mol) of glycidyl methacrylate and 3 g (0.027 mol) of mercapto-1,2-propanediol, and a mixed solution containing 3 g of 2,2'-azobis(2-methylpropionitrile) and 100 g of methyl ethyl ketone were added dropwise, respectively, over 3 hrs at the same temperature, and the polymerization was allowed while maintaining this temperature for 3 hrs. The compound solution thus obtained was subjected to precipitation and purification with 3 L of methanol to eliminate residual monomers, the radical polymerization initiator and the like, and then propylene glycol monomethyl ether acetate was added to the product to obtain a solution containing 10% by mass of the compound (A-2). The compound (A-2) had the Mw of 6,715, the Mn of 4,874, and the Mw/Mn of 1.38.

Synthesis Example 3

Production of Compound (A-3)

To a flask equipped with a condenser and a stirrer was charged 100 g of methyl ethyl ketone, and the interior of the flask was purged with nitrogen. After the flask was heated to 85° C., a mixed solution containing 100 g of methyl ethyl ketone, 51 g (0.49 mol) of styrene, 49 g (0.49 mol) of methyl methacrylate and 3 g (0.027 mol) of mercapto-1,2-propanediol, and a mixed solution containing 4 g of "PERBUTYL® O" (t-butylperoxy-2-ethylhexanoate) available from NOF Corporation and 100 g of methyl ethyl ketone were added dropwise, respectively, over 3 hrs at the same temperature, and the polymerization was allowed while maintaining this temperature for 3 hrs. The compound solution thus obtained was subjected to precipitation and purification with 3 L of methanol to eliminate residual monomers, the radical polymerization initiator and the like, and then propylene glycol monomethyl ether acetate was added to the product to obtain a solution containing 10% by mass of the compound (A-3). The compound (A-3) had the Mw of 6,802, the Mn of 4,834, and the Mw/Mn of 1.41.

Synthesis Example 4

Production of Compound (A-4)

To a flask equipped with a condenser and a stirrer was charged 100 g of methyl ethyl ketone, and the interior of the flask was purged with nitrogen. After the flask was heated to 85° C., a mixed solution containing 100 g of methyl ethyl ketone, 48 g (0.46 mol) of styrene, 46 g (0.46 mol) of methyl methacrylate, 6 g (0.036 mol) of cyclohexyl methacrylate and 4.9 g (0.027 mol) of 9-mercapto-1-nonanol, and a mixed solution containing 3 g of 2,2'-azobis(2,4-dimethylvaleronitrile) and 100 g of methyl ethyl ketone were added dropwise, respectively, over 3 hrs at the same temperature, and the polymerization was allowed while maintaining this temperature for 3 hrs. The compound solution thus obtained was subjected to precipitation and purification with 3 L of methanol to eliminate residual monomers, the radical polymerization initiator and the like, and then propylene glycol monomethyl ether acetate was added to the product to obtain a solution containing 10% by mass of the compound (A-4). The compound (A-4) had the Mw of 7,132, the Mn of 5,465, and the Mw/Mn of 1.31.

Synthesis Example 5

Production of Compound (A-5)

To a flask equipped with a condenser and a stirrer was charged 100 g of methyl ethyl ketone, and the interior of the flask was purged with nitrogen. After the flask was heated to 85° C., a mixed solution containing 100 g of methyl ethyl ketone, 51 g (0.49 mol) of styrene, 49 g (0.49 mol) of methyl methacrylate and 5.3 g (0.027 mol) of 3-mercaptopropyltrimethoxysilane, and a mixed solution containing 3 g of 2,2'-azobis(2,4-dimethylvaleronitrile) and 100 g of methyl ethyl ketone were added dropwise, respectively, over 3 hrs at the same temperature, and the polymerization was allowed while maintaining this temperature for 3 hrs. The compound solution thus obtained was subjected to precipitation and purification with 3 L of methanol to eliminate residual monomers, the radical polymerization initiator and the like, and then propylene glycol monomethyl ether acetate was added to the product to obtain a solution containing 10% by mass of the compound (A-5). The compound (A-5) had the Mw of 7,048, the Mn of 5,121, and the Mw/Mn of 1.38.

Synthesis Example 6

Production of Compound (A-6)

To a flask equipped with a condenser and a stirrer was charged 100 g of methyl ethyl ketone, and the interior of the flask was purged with nitrogen. After the flask was heated to 85° C., a mixed solution containing 100 g of methyl ethyl ketone, 48 g (0.46 mol) of styrene, 46 g (0.46 mol) of methyl methacrylate, 6 g (0.027 mol) of dicyclopentanylmethacrylate and 4.9 g (0.027 mol) of 3-mercaptopropyldimethoxymethylsilane, and a mixed solution containing 3 g of 2,2'-azobis(2,4-dimethylvaleronitrile) and 100 g of methyl ethyl ketone were added dropwise, respectively, over 3 hrs at the same temperature, and the polymerization was allowed while maintaining this temperature for 3 hrs. The compound solution thus obtained was subjected to precipitation and purification with 3 L of methanol to eliminate residual monomers, the radical polymerization initiator and the like, and then propylene glycol monomethyl ether acetate was added to the product to obtain a solution containing 10% by mass of the compound (A-6). The compound (A-6) had the Mw of 7,197, the Mn of 5,063, and the Mw/Mn of 1.42.

Synthesis Example 7

Production of Compound (A-7)

To a flask equipped with a condenser and a stirrer was charged 100 g of methyl ethyl ketone, and the interior of the flask was purged with nitrogen. After the flask was heated to 85° C., a mixed solution containing 100 g of methyl ethyl ketone, 51 g (0.49 mol) of styrene, 49 g (0.49 mol) of methyl methacrylate and 5.5 g (0.027 mol) of mercaptoundecene, and a mixed solution containing 3 g of 2,2'-azobis(2,4-dimethylvaleronitrile) and 100 g of methyl ethyl ketone were added dropwise, respectively, over 3 hrs at the same temperature, and the polymerization was allowed while maintaining this temperature for 3 hrs. The compound solution thus obtained was subjected to precipitation and purification with 3 L of methanol to eliminate residual monomers, the radical polymerization initiator and the like, and then propylene glycol monomethyl ether acetate was added to the product to obtain a solution containing 10% by mass of the compound (A-7). The compound (A-7) had the Mw of 7,201, the Mn of 5,114, and the Mw/Mn of 1.41.

Synthesis Example 8

Production of Compound (A-8)

To a flask equipped with a condenser and a stirrer was charged 100 g of methyl ethyl ketone, and the interior of the flask was purged with nitrogen. After the flask was heated to 85° C., a mixed solution containing 100 g of methyl ethyl ketone and 100 g (1.00 mol) of styrene, and a mixed solution containing 8 g of "PERBUTYL® O" available from NOF Corporation and 100 g of methyl ethyl ketone were added dropwise, respectively, over 3 hrs at the same temperature, and the polymerization was allowed while maintaining this temperature for 3 hrs. The compound solution thus obtained was subjected to precipitation and purification with 3 L of methanol to eliminate residual monomers, the radical polymerization initiator and the like, and then propylene glycol monomethyl ether acetate was added to the product to obtain a solution containing 10% by mass of the compound (A-8). The compound (A-8) had the Mw of 7,365, the Mn of 5,312, and the Mw/Mn of 1.39.

Synthesis Example 9

Production of Compound (A-9)

To a flask equipped with a condenser and a stirrer was charged 100 g of methyl ethyl ketone, and the interior of the flask was purged with nitrogen. After the flask was heated to 85° C., a mixed solution containing 100 g of methyl ethyl ketone and 100 g (1.00 mol) of methyl methacrylate, and a mixed solution containing 8 g of "PERBUTYL® O" available from NOF Corporation and 100 g of methyl ethyl ketone were added dropwise, respectively, over 3 hrs at the same temperature, and the polymerization was allowed while maintaining this temperature for 3 hrs. The compound solution thus obtained was subjected to precipitation and purification with 3 L of methanol to eliminate residual monomers, the radical polymerization initiator and the like, and then propylene glycol monomethyl ether acetate was added to the product to obtain a solution containing 10% by mass of the compound (A-9). The compound (A-9) had the Mw of 7,732, the Mn of 5,862, and the Mw/Mn of 1.32.

Synthesis Example 10

Production of Compound (A-10)

To a flask equipped with a condenser and a stirrer was charged 100 g of methyl ethyl ketone, and the interior of the flask was purged with nitrogen. After the flask was heated to 85° C., a mixed solution containing 100 g of methyl ethyl ketone, 45 g (0.43 mol) of styrene, 43 g (0.43 mol) of methyl methacrylate, 12 g (0.056 mol) of 2-acetoacetoxyethyl methacrylate and 5.3 g (0.027 mol) of 3-mercaptopropyltrimethoxysilane, and a mixed solution containing 3 g of 2,2'-azobis(2,4-dimethylvaleronitrile) and 100 g of methyl ethyl ketone were added dropwise, respectively, over 3 hrs at the same temperature, and the polymerization was allowed while maintaining this temperature for 3 hrs. The compound solution thus obtained was subjected to precipitation and purification with 3 L of methanol to eliminate residual monomers, the radical polymerization initiator and the like, and then propylene glycol monomethyl ether acetate was added to the product to obtain a solution containing 10% by mass of the compound (A-10). The compound (A-10) had the Mw of 7,045, the Mn of 5,076, and the Mw/Mn of 1.39.

Synthesis Example 11

Production of Chain Transfer Agent (a-1)

In a nitrogen atmosphere, 32.6 g (0.166 mol) of 3-mercaptopropyltrimethoxysilane and 31.9 g (0.179 mol) of n-butyltrimethoxysilane were charged into a three-neck flask, and 100 g of methyl isobutyl ketone was added to allow the charged compounds to be dissolved, and the solution obtained was heated to 60° C. while stirring with a magnetic stirrer. To this solution was continuously added 8.6 g of an aqueous oxalic acid solution containing 1% by mass oxalic acid over 1 hour, and a reaction was allowed at 60° C. for 4 hrs. Thereafter, water, methanol and methyl isobutyl ketone were distilled away under a reduced pressure. The resultant product was dissolved in toluene, and washed with water three times using a separatory funnel, followed by dewatering by using a drying agent. Toluene was distilled away under a reduced pressure, and then the product was diluted with propylene glycol monomethyl ether acetate to obtain a solution containing 10% by mass of the chain transfer agent (a-1). The chain transfer agent (a-1) had the Mw of 2,615, the Mn of 1,214, and the Mw/Mn of 2.15. Infrared spectroscopy of the resulting chain transfer agent confirmed an absorption derived from a silanol group at 3750 cm$^{-1}$.

Synthesis Example 12

Production of Chain Transfer Agent (a-2)

In a nitrogen atmosphere, 32.6 g (0.166 mol) of 3-mercaptopropyltrimethoxysilane and 24.4 g (0.179 mol) of methyltrimethoxysilane were charged into a three-neck flask, and 100 g of methyl isobutyl ketone was added to allow the charged compounds to be dissolved, and the solution obtained was heated to 60° C. while stirring with a magnetic stirrer. To this solution was continuously added 8.6 g of an aqueous oxalic acid solution containing 1% by mass oxalic acid over 1 hour, and a reaction was allowed at 60° C. for 4 hrs. Thereafter, water, methanol and methyl isobutyl ketone were distilled away under a reduced pressure. The resultant product was dissolved in toluene, and washed with water three times using a separatory funnel, followed by dewatering by using a drying agent. Toluene was distilled away under a reduced pressure, and then the product was diluted with propylene glycol monomethyl ether acetate to obtain a solution containing 10% by mass of the chain transfer agent (a-2). The chain transfer agent (a-2) had the Mw of 2,738, the Mn of 1,241, and the Mw/Mn of 2.21. Infrared spectroscopy of the resulting chain transfer agent confirmed an absorption derived from a silanol group at 3750 cm$^{-1}$.

Synthesis Example 13

Production of Compound (A-11)

To a flask equipped with a condenser and a stirrer was charged 100 g of methyl ethyl ketone, and the interior of the flask was purged with nitrogen. After the flask was heated to 85° C., a mixed solution containing 100 g of methyl ethyl ketone, 51 g (0.49 mol) of styrene, 49 g (0.49 mol) of methyl methacrylate and 30 g of a solution containing a 10% by mass chain transfer agent (a-1), and a mixed solution containing 3 g of 2,2'-azobis(2-methylpropionitrile) and 100 g of methyl ethyl ketone were added dropwise, respectively, over 3 hrs at the same temperature, and the polymerization was allowed while maintaining this temperature for 3 hrs. The compound solution thus obtained was subjected to precipitation and purification with 3 L of methanol to eliminate residual monomers, the radical polymerization initiator and the like, and then propylene glycol monomethyl ether acetate was added to the product to obtain a solution containing 10% by mass of the compound (A-11). The compound (A-11) had the Mw of 8,280, the Mn of 4,465, and the Mw/Mn of 1.84.

Synthesis Example 14

Production of Compound (A-12)

To a flask equipped with a condenser and a stirrer was charged 100 g of methyl ethyl ketone, and the interior of the flask was purged with nitrogen. After the flask was heated to 85° C., a mixed solution containing 100 g of methyl ethyl ketone, 51 g (0.49 mol) of styrene, 49 g (0.49 mol) of methyl methacrylate and 30 g of a solution containing a 10% by mass chain transfer agent (a-1), and a mixed solution containing 4 g of "PERBUTYL® O" available from NOF Corporation (t-butylperoxy-2-ethylhexanoate) and 100 g of methyl ethyl ketone were added dropwise, respectively, over 3 hrs at the same temperature, and the polymerization was allowed while maintaining this temperature for 3 hrs. The compound solution thus obtained was subjected to precipitation and purification with 3 L of methanol to eliminate residual monomers, the radical polymerization initiator and the like, and then propylene glycol monomethyl ether acetate was added to the product to obtain a solution containing 10% by mass of the compound (A-12). The compound (A-12) had the Mw of 7,880, the Mn of 4,267, and the Mw/Mn of 1.85.

Synthesis Example 15

Production of Compound (A-13)

To a flask equipped with a condenser and a stirrer was charged 100 g of methyl ethyl ketone, and the interior of the flask was purged with nitrogen. After the flask was heated to 85° C., a mixed solution containing 100 g of methyl ethyl ketone, 48 g (0.46 mol) of styrene, 46 g (0.46 mol) of methyl methacrylate, 6 g (0.027 mol) of dicyclopentanyl methacrylate and 30 g of a solution containing a 10% by mass chain transfer agent (a-2), and a mixed solution containing 3 g of 2,2'-azobis(2-methylpropionitrile) and 100 g of methyl ethyl ketone were added dropwise, respectively, over 3 hrs at the same temperature, and the polymerization was allowed while maintaining this temperature for 3 hrs. The compound solution thus obtained was subjected to precipitation and purification with 3 L of methanol to eliminate residual monomers, the radical polymerization initiator and the like, and then propylene glycol monomethyl ether acetate was added to the product to obtain a solution containing 10% by mass of the compound (A-13). The compound (A-13) had the Mw of 8,280, the Mn of 4,465, and the Mw/Mn of 1.84.

Synthesis Example 16

Production of Compound (A-14)

To a flask equipped with a condenser and a stirrer was charged 100 g of methyl ethyl ketone, and the interior of the flask was purged with nitrogen. After the flask was heated to 85° C., 100 g of methyl ethyl ketone, a mixed solution containing 51 g (0.49 mol) of styrene, 49 g (0.49 mol) of methyl methacrylate, 30 g of a solution containing a 10% by mass chain transfer agent (a-2), and a mixed solution containing 4 g of "PERBUTYL® O" available from NOF Corporation and 100 g of methyl ethyl ketone were added dropwise, respectively, over 3 hrs at the same temperature, and the polymerization was allowed while maintaining this temperature for 3 hrs. The compound solution thus obtained was subjected to precipitation and purification with 3 L of methanol to eliminate residual monomers, the radical polymerization initiator and the like, and then propylene glycol monomethyl ether acetate was added to the product to obtain a solution containing 10% by mass of the compound (A-14). The compound (A-14) had the Mw of 7,750, the Mn of 3,987, and the Mw/Mn of 1.94.

Synthesis Example 17

Production of Compound (A-15)

To a flask equipped with a condenser and a stirrer was charged 100 g of methyl ethyl ketone, and the interior of the flask was purged with nitrogen. After the flask was heated to 85° C., a mixed solution containing 100 g of methyl ethyl ketone, 48 g (0.46 mol) of styrene, 46 g (0.46 mol) of methyl methacrylate, 6 g (0.036 mol) of cyclohexyl methacrylate, 12 g of a chain transfer agent (a-3) (Arakawa Chemical Industries, Ltd., "COMPOCERAN HBSQ105-9", a 25% by mass propylene glycol monomethyl ether acetate solution), and a mixed solution containing 3 g of 2,2'-azobis(2-methylpropionitrile) and 100 g of methyl ethyl ketone were added dropwise, respectively, over 3 hrs at the same temperature, and the polymerization was allowed while maintaining this temperature for 3 hrs. The compound solution thus obtained was subjected to precipitation and purification with 3 L of methanol to eliminate residual monomers, the radical polymerization initiator and the like, and then propylene glycol monomethyl ether acetate was added to the product to obtain a solution containing 10% by mass of the compound (A-15). The compound (A-15) had the Mw of 7,980, the Mn of 4,002, and the Mw/Mn of 2.00.

Synthesis Example 18

Production of Compound (A-16)

To a flask equipped with a condenser and a stirrer was charged 100 g of methyl ethyl ketone, and the interior of the flask was purged with nitrogen. After the flask was heated to 85° C., a mixed solution containing 100 g of methyl ethyl ketone, 51 g (0.49 mol) of styrene, 49 g (0.49 mol) of methyl methacrylate, 12 g of the chain transfer agent (a-3) (Arakawa Chemical Industries, Ltd., "COMPOCERAN HBSQ105-9", a 25% by mass propylene glycol monomethyl ether acetate solution), and a mixed solution containing 4 g of "PERBUTYL® O" available from NOF Corporation and 100 g of methyl ethyl ketone were added dropwise, respectively; over 3 hrs at the same temperature, and the polymerization was allowed while maintaining this temperature for 3 hrs. The compound solution thus obtained was subjected to precipitation and purification with 3 L of methanol to eliminate residual monomers, the radical polymerization initiator and the like, and then propylene glycol monomethyl ether acetate was added to the product to obtain a solution containing 10% by mass of the compound (A-16). The compound (A-16) had the Mw of 7,807, the Mn of 3,869, and the Mw/Mn of 2.02.

Synthesis Example 19

Production of Block Copolymer (P-1)

After a 500 mL flask as a reaction vessel was dried under reduced pressure, in a nitrogen atmosphere, 200 g of tetrahydrofuran which had been subjected to a distillation dehydrating treatment was charged, and cooled to −78° C. Thereafter, 0.27 g of a 1 N sec-butyl lithium (sec-BuLi) solution in cyclohexane was charged, and 10.7 g of styrene (0.103 mol) which had been subjected to a distillation dehydrating treatment was added dropwise thereto over 30 min. During this operation, the temperature of the reaction solution was carefully adjusted so as not to be −60° C. or higher. After completion of the dropwise addition, the mixture was aged for 30 min, and then 10.3 g (0.103 mol) of methyl methacrylate which had been subjected to a distillation dehydrating treatment was further added dropwise over 30 min, followed by allowing for the reaction for 30 min. Thereafter, 1 mL of methanol as an end treatment agent was charged, and the reaction was permitted. The temperature of the reaction solution was elevated to a room temperature, and the obtained reaction solution was concentrated. Substitution with propylene glycol methyl ether acetate (PGMEA) was followed by charging 1,000 g of a 2% by mass aqueous oxalic acid solution, and the mixture was stirred and left to stand. Then an aqueous layer as the underlayer was eliminated. This operation was repeated three times to eliminate the Li salt, then 1,000 g of ultra pure water was charged, and the mixture was stirred, followed by elimination of the aqueous layer as the underlayer. After this operation was repeated three times to eliminate oxalic acid, the solution was concentrated and added into 500 g of methanol dropwise, thereby allowing the polymer to be precipitated. After a vacuum-filtrated polymer was washed with methanol twice, drying under reduced pressure at 60° C. gave 20.5 g of a white block copolymer (P-1). The block copolymer (P-1) had the Mw of 41,000 and the Mw/Mn of 1.13. In addition, as a result of a $^{13}$C-NMR analysis, the proportion of the styrene unit and the proportion of the methyl methacrylate unit contained in the block copolymer (P-1) were 50.1 (mol %) and 49.9 (mol %), respectively. It should be noted that the block copolymer (P-1) was a diblock copolymer.

Preparation of Base Film-Forming Composition

The solvent (B) and the acid generating agent (C) that constitute the base film-forming compositions, other than the compounds (A-1) to (A-16), are shown below.

(B) Solvent
  B-1: propylene glycol monomethyl ether acetate
  B-2: butoxymethyl acetate
  B-3: butyl acetate
  B-4: cyclohexanone (C) Acid Generating Agent
  C-1: triphenylsulfonium 2-(bicyclo[2.2.1]hept-2-yl)-1,1,2,2-tetrafluoroethane-1-sulfonate
  C-2: bis(4-t-butylphenyl)iodonium nonafluoro-n-butane-sulfonate The structure of each compound is shown below.

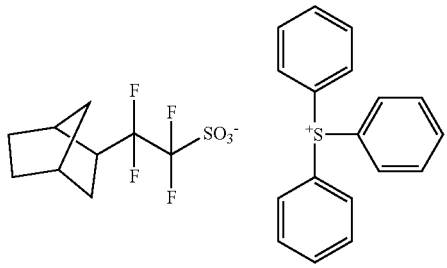

(C-1)

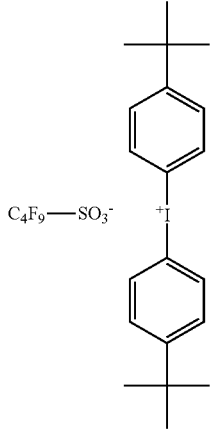

(C-2)

Example 1

Preparation of Base Film-Forming Composition (D-1)

As a solution containing the compound (A), 100 parts by mass of a solution containing the compound (A-1) obtained in Synthesis Example 1; as the solvent (B), 9,895 parts by mass of propylene glycol monomethyl ether acetate (B-1); and as the acid generating agent (C), 5 parts by mass of triphenylsulfonium 2-(bicyclo[2.2.1]hept-2-yl)-1,1,2,2-tetrafluoroethane-1-sulfonate (C-1) were mixed to permit dissolution, whereby a mixed solution was obtained. The mixed solution thus obtained was filtered through a membrane filter having a pore size of 0.1 µm to prepare a base film-forming composition (D-1).

Examples 2 to 15 and Comparative Examples 1 to 4

Preparation of Base Film-Forming Compositions (D-2) to (D-19)

In a similar manner to Example 1 except that each component of the type and the content shown in Tables 1-1 and 1-2 below was employed, base film-forming compositions (D-2) to (D-19) of Examples 2 to 15 and Comparative Examples 1 to 4 were prepared. Note that "-" in Tables 1-1 and 1-2 denotes that any component was not used, "Ex." means Example, and "Comp. Ex." means Comparative Example.

TABLE 1-1

| Base film-forming composition | | Ex. 1 D-1 | Ex. 2 D-2 | Ex. 3 D-3 | Ex. 4 D-4 | Ex. 5 D-5 | Ex. 6 D-6 | Ex. 7 D-7 | Ex. 8 D-8 | Ex. 9 D-9 | Ex. 10 D-10 |
|---|---|---|---|---|---|---|---|---|---|---|---|
| Solution containing compound (A) | A-1 | 100 | — | — | — | — | — | 100 | — | — | — |
| | A-2 | — | 100 | — | — | — | — | — | — | — | — |
| | A-3 | — | — | 100 | — | — | — | — | 100 | — | — |
| | A-4 | — | — | — | 100 | — | — | — | — | — | — |
| | A-5 | — | — | — | — | 100 | — | — | — | 100 | — |
| | A-6 | — | — | — | — | — | 100 | — | — | — | — |

TABLE 1-1-continued

| Base film-forming composition | | Ex. 1 D-1 | Ex. 2 D-2 | Ex. 3 D-3 | Ex. 4 D-4 | Ex. 5 D-5 | Ex. 6 D-6 | Ex. 7 D-7 | Ex. 8 D-8 | Ex. 9 D-9 | Ex. 10 D-10 |
|---|---|---|---|---|---|---|---|---|---|---|---|
| | A-7 | — | — | — | — | — | — | — | — | — | — |
| | A-8 | — | — | — | — | — | — | — | — | — | — |
| | A-9 | — | — | — | — | — | — | — | — | — | — |
| | A-10 | — | — | — | — | — | — | — | — | — | — |
| | A-11 | — | — | — | — | — | — | — | — | — | 100 |
| | A-12 | — | — | — | — | — | — | — | — | — | — |
| | A-13 | — | — | — | — | — | — | — | — | — | — |
| | A-14 | — | — | — | — | — | — | — | — | — | — |
| | A-15 | — | — | — | — | — | — | — | — | — | — |
| | A-16 | — | — | — | — | — | — | — | — | — | — |
| Solvent (B) | B-1 | 9,895 | — | 9,895 | — | 9,895 | — | 9,895 | 9,895 | 9,895 | 9,895 |
| | B-2 | — | 9,895 | — | — | — | — | — | — | — | — |
| | B-3 | — | — | — | 9,895 | — | — | — | — | — | — |
| | B-4 | — | — | — | — | — | 9,895 | — | — | — | — |
| Acid generating agent (C) | C-1 | 5 | 5 | 5 | 5 | 5 | 5 | — | — | — | 5 |
| | C-2 | — | — | — | — | — | — | 5 | 5 | 5 | — |
| Solid content concentration (mass %) | | 0.15 | 0.15 | 0.15 | 0.15 | 0.15 | 0.15 | 0.15 | 0.15 | 0.15 | 0.15 |

TABLE 1-2

| Base film-forming composition | | Ex. 11 D-11 | Ex. 12 D-12 | Ex. 13 D-13 | Ex. 14 D-14 | Ex. 15 D-15 | Comp. Ex. 1 D-16 | Comp. Ex. 2 D-17 | Comp. Ex. 3 D-18 | Comp. Ex. 4 D-19 |
|---|---|---|---|---|---|---|---|---|---|---|
| Solution containing compound (A) | A-1 | — | — | — | — | — | — | — | — | — |
| | A-2 | — | — | — | — | — | — | — | — | — |
| | A-3 | — | — | — | — | — | — | — | — | — |
| | A-4 | — | — | — | — | — | — | — | — | — |
| | A-5 | — | — | — | — | — | — | — | — | — |
| | A-6 | — | — | — | — | — | — | — | — | — |
| | A-7 | — | — | — | — | — | 100 | — | — | — |
| | A-8 | — | — | — | — | — | — | 100 | — | — |
| | A-9 | — | — | — | — | — | — | — | 100 | — |
| | A-10 | — | — | — | — | — | — | — | — | 100 |
| | A-11 | — | — | — | — | — | — | — | — | — |
| | A-12 | 100 | — | — | — | — | — | — | — | — |
| | A-13 | — | 100 | — | — | — | — | — | — | — |
| | A-14 | — | — | 100 | — | — | — | — | — | — |
| | A-15 | — | — | — | 100 | — | — | — | — | — |
| | A-16 | — | — | — | — | 100 | — | — | — | — |
| Solvent (B) | B-1 | 9,895 | 9,895 | 9,895 | 9,895 | 9,895 | 9,895 | 9,895 | 9,895 | 9,895 |
| | B-2 | — | — | — | — | — | — | — | — | — |
| | B-3 | — | — | — | — | — | — | — | — | — |
| | B-4 | — | — | — | — | — | — | — | — | — |
| Acid generating agent (C) | C-1 | 5 | 5 | 5 | 5 | 5 | 5 | 5 | 5 | 5 |
| | C-2 | — | — | — | — | — | — | — | — | — |
| Solid content concentration (mass %) | | 0.15 | 0.15 | 0.15 | 0.15 | 0.15 | 0.15 | 0.15 | 0.15 | 0.15 |

Directed Self-Assembly Lithography Method

The base film-forming composition thus obtained was used to provide a first substrate having a base film formed thereon, and the first substrate having the base film formed thereon was used to form a pattern.

(1) Preparation of Directed Self-Assembling Composition for Pattern Formation

The block copolymer (P-1) obtained was dissolved in propylene glycol monomethyl ether acetate (PGMEA) to prepare a 1% by mass solution. This solution was filtered through a membrane filter having a pore size of 200 nm to prepare a directed self-assembling composition for pattern formation (E-1).

(2) Base Film Formation of First Layer

The base film-forming compositions (D-1) to (D-19) obtained were used to provide a coating film on the surface of a 12-inch silicon wafer, and the coating film was exposed to ArF light having a wavelength of 193 nm, followed by baking at 200° C. for 120 sec. Next, in order to eliminate a solution containing an unreacted polymer, washing with propylene glycol monomethyl ether acetate, followed by drying of the substrate at 100° C. for 120 sec provided the coating film having an average thickness of 10 nm.

Measurement of Receding Contact Angle (RCA)

The receding contact angle was measured by using a contact angle meter (KRUS Co., "DSA-10"), immediately after producing the substrate (wafer) having the base film formed thereon with the base film-forming composition, in an environment involving a room temperature of 23° C., a humidity of 45% and a normal pressure in accordance with the following procedure.

First, the position of a wafer stage of the contact angle meter was adjusted, and the wafer was placed on the adjusted stage. Next, water was injected into a needle, and the position of the needle was fine-tuned to an initial position which allowed a bead of water to be formed on the wafer placed as above. Thereafter, water was discharged from the needle to form a 25 μL bead of water on the wafer, the needle was once retracted from the bead of water, and the position of the needle was turned back to the initial position such that a tip of the needle was positioned in the bead of water. Subsequently, the water was aspirated for 150 sec with the needle at a rate of 10 μL/min, during which a contact angle was concurrently measured once per second, 150 times in total. Of the measurement values, contact angle measurements (at 20 time points in total) acquired for 20 sec after the time point when the measurement of the contact angle became stable were averaged to obtain a reading of the receding contact angle (unit: degree (°)). The measurements obtained are shown in Table 2.

(3) Pattern Formation

The directed self-assembling composition for pattern formation (E-1) was applied so as to give the directed self-assembling film having an average film thickness of 30 nm formed on the silicon wafer substrate having the base film formed thereon, and thereafter heated at 250° C. for 10 min to cause phase separation, whereby a fingerprint having a microdomain structure was formed. Thereafter, dry etching was carried out through a plasma treatment to form a relief pattern having a pitch of 30 nm.

The fingerprint and the cross sections of the pattern formed as described above were observed by using a scanning electron microscope ("S-4800", Hitachi, Ltd.), whereby evaluations were made on the excellence of the phase separation structure in the fingerprint, and the rectangularity of the pattern configuration. With respect to the fingerprint, the evaluation was made as "A" (favorable) when a clear phase separation was confirmed and no defect was found, whereas the evaluation was made as "B" (unfavorable) when the phase separation was insufficient or any defect was found. Furthermore, with respect to the pattern configuration, the evaluation was made as "A" (favorable) when the pattern configuration was found to be rectangular, whereas the evaluation was made as "B" (unfavorable) when the pattern configuration was not found to be rectangular such as a case in which an undissolved matter or the like was remarkable. The results of the evaluations are shown in Table 2.

TABLE 2

| | Base film-forming composition | Contact angle between the interface and water receding contact angle (°) | Fingerprint excellence of phase separation structure | Pattern configuration rectangularity |
|---|---|---|---|---|
| Example 1 | D-1 | 72.9 | A | A |
| Example 2 | D-2 | 73.8 | A | A |
| Example 3 | D-3 | 73.1 | A | A |
| Example 4 | D-4 | 71.3 | A | A |
| Example 5 | D-5 | 79.4 | A | A |
| Example 6 | D-6 | 79.1 | A | A |
| Example 7 | D-7 | 73.0 | A | A |
| Example 8 | D-8 | 73.1 | A | A |
| Example 9 | D-9 | 79.2 | A | A |
| Example 10 | D-10 | 81.2 | A | A |
| Example 11 | D-11 | 83.2 | A | A |
| Example 12 | D-12 | 82.1 | A | A |
| Example 13 | D-13 | 81.9 | A | A |
| Example 14 | D-14 | 82.4 | A | A |
| Example 15 | D-15 | 82.6 | A | A |
| Comparative Example 1 | D-16 | 69.5 | B | B |
| Comparative Example 2 | D-17 | 69.5 | B | B |

TABLE 2-continued

| | Base film-forming composition | Contact angle between the interface and water receding contact angle (°) | Fingerprint excellence of phase separation structure | Pattern configuration rectangularity |
|---|---|---|---|---|
| Comparative Example 3 | D-18 | 68.1 | B | B |
| Comparative Example 4 | D-19 | 68.1 | B | B |

As is clear from the results shown in Table 2, Examples revealed that: the receding contact angle of the surface of the first substrate having the base film formed thereon fell within a favorable range; the phase separation structure of the fingerprint was favorable; and the pattern configuration was rectangular. On the other hand, Comparative Examples revealed that: the receding contact angle of the surface of the first substrate having the base film formed thereon failed to fall within the favorable range; the phase separation structure of the fingerprint was not favorable; and the pattern configuration was not rectangular.

According to the base film-forming composition and directed self-assembly lithography method of the embodiment of the present invention, a phase separation structure can be favorably formed by directed self-assembly, and a rectangular pattern can be formed. Therefore, these can be suitably used in lithography processes in manufacture of various types of electronic devices such as semiconductor devices and liquid crystal devices for which further miniaturization has been demanded.

Obviously, numerous modifications and variations of the present invention are possible in light of the above teachings. It is therefore to be understood that within the scope of the appended claims, the invention may be practiced otherwise than as specifically described herein.

What is claimed is:

1. A directed self-assembly lithography method comprising:

applying a base film-forming composition on a first layer comprising a silicon atom such that a base film is provided on the first layer;

providing a directed self-assembling film on a first surface of the base film opposite to a second surface on which the first layer is provided, the directed self-assembling film comprising a plurality of phases; and removing at least a part of the plurality of phases of the directed self-assembling film, wherein the base film-forming composition comprises:

a compound represented by formula (1); and a solvent, and wherein a receding contact angle of the base film for pure water is no less than 70° and no greater than 90°,

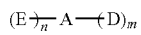

$$(E)_n-A-(D)_m \qquad (1)$$

wherein, in the formula (1), A represents a linking group having a valency of (m+n); D represents a monovalent organic group having at least 10 carbon atoms and comprising a sulfur atom; E represents the group capable of reacting with Si—OH or Si—H; and m and n are each independently an integer of 1 to 200, wherein in a case where m is 2 or greater, a plurality of Ds are identical or different, two or more Ds are optionally bound with each other, and in a case where n is 2 or greater, a plurality of Es are identical or different.

2. The directed self-assembly lithography method according to claim 1, further comprising:
forming a prepattern on the base film on the first surface of the base film after providing the base film and before providing the directed self-assembling film,
wherein, in providing the directed self-assembling film, the directed self-assembling film is provided on a region in which the prepattern is not formed.

3. The directed self-assembly lithography method according to claim 1, wherein A in the formula (1) represents an organic group having 1 to 30 carbon atoms, and n is an integer of 1 to 10.

4. A directed self-assembly lithography method comprising:
applying a base film-forming composition on a first layer comprising a silicon atom such that a base film is provided on the first layer;
providing a directed self-assembling film on a first surface of the base film opposite to a second surface on which the first layer is provided, the directed self-assembling film comprising a plurality of phases; and
removing at least a part of the plurality of phases of the directed self-assembling film,
wherein the base film-forming composition comprises:
a compound represented by formula (1); and
a solvent, and
wherein a receding contact angle of the base film for pure water is no less than 70° and no greater than 90°, $$(E)_{\overline{n}}A\text{---}(D)_m \quad (1)$$

wherein, in the formula (1), A represents a group represented by formula (3), D represents a monovalent organic group having at least 10 carbon atoms; E represents the group capable of reacting with Si—OH or Si—H; and m and n are each independently an integer of 1 to 200, wherein in a case where m is 2 or greater, a plurality of Ds are identical or different, two or more Ds are optionally bound with each other, and in a case where n is 2 or greater, a plurality of Es are identical or different, $$(*^1)_{\overline{n}}Q\text{---}(T\text{---}*^2)_m \quad (3)$$

wherein, in the formula (3), Q represents a polysiloxane structure having a valency of (m+n) and having 2 to 100 silicon atoms; T represents a divalent organic group having 1 to 30 carbon atoms that bonds to the silicon atom in Q at the carbon atom or oxygen atom; m and n are as defined in the formula (1); $*^1$ denotes a site bound to E in the formula (1); and $*^2$ denotes a site bound to D in the formula (1).

5. A directed self-assembly lithography method comprising:
applying a base film-forming composition on a first layer comprising a silicon atom such that a base film is provided on the first layer;
providing a directed self-assembling film on a first surface of the base film opposite to a second surface on which the first layer is provided, the directed self-assembling film comprising a plurality of phases; and
removing at least a part of the plurality of phases of the directed self-assembling film,
wherein the base film-forming composition comprises:
a compound represented by formula (1); and
a solvent, and
wherein a receding contact angle of the base film for pure water is no less than 70° and no greater than 90°, $$(E)_{\overline{n}}A\text{---}(D)_m \quad (1)$$

wherein, in the formula (1), A represents a linking group having a valency of (m+n); D represents a monovalent organic group having at least 10 carbon atoms; E represents the group capable of reacting with Si—OH or Si—H; and m and n are each independently an integer of 1 to 200, wherein in a case where m is 2 or greater, a plurality of Ds are identical or different, two or more Ds are optionally bound with each other, and in a case where n is 2 or greater, a plurality of Es are identical or different, and
wherein the compound is obtained by subjecting a vinyl monomer to radical polymerization in the presence of a chain transfer agent represented by formula (4):

$$(E)_{\overline{n}}A\text{---}(SH)_m \quad (4)$$

wherein, in the formula (4), A, E, m and n are as defined in the formula (1).

6. The directed self-assembly lithography method according to claim 1, wherein A in the formula (1) represents a group represented by formula (3):

$$(*^1)_{\overline{n}}Q\text{---}(T\text{---}*^2)_m \quad (3)$$

wherein, in the formula (3), Q represents a polysiloxane structure having a valency of (m+n) and having 2 to 100 silicon atoms; T represents a divalent organic group having 1 to 30 carbon atoms that bonds to the silicon atom in Q at the carbon atom or oxygen atom; m and n are as defined in the formula (1); $*^1$ denotes a site bound to E in the formula (1); and $*^2$ denotes a site bound to D in the formula (1).

7. The directed self-assembly lithography method according to claim 1, wherein the compound is obtained by subjecting a vinyl monomer to radical polymerization in the presence of a chain transfer agent represented by formula (4):

$$(E)_{\overline{n}}A\text{---}(SH)_m \quad (4)$$

wherein, in the formula (4), A, E, m and n are as defined in the formula (1).

8. The directed self-assembly lithography method according to claim 7, wherein A in the formula (1) represents an organic group having 1 to 30 carbon atoms, and n is an integer of 1 to 10.

9. The directed self-assembly lithography method according to claim 7, wherein A in the formula (1) represents a group represented by formula (3):

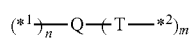
(3)

wherein, in the formula (3), Q represents a polysiloxane structure having a valency of (m+n) and having 2 to 100 silicon atoms; T represents a divalent organic group having 1 to 30 carbon atoms that bonds to the silicon atom in Q at the carbon atom or oxygen atom; m and n are as defined in the formula (1); $*^1$ denotes a site bound to E in the formula (1); and $*^2$ denotes a site bound to D in the formula (1).

10. The directed self-assembly lithography method according to claim 8, wherein A in the formula (1) represents a group represented by formula (3):

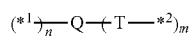
(3)

wherein, in the formula (3), Q represents a polysiloxane structure having a valency of (m+n) and having 2 to 100 silicon atoms; T represents a divalent organic group having 1 to 30 carbon atoms that bonds to the silicon atom in Q at the carbon atom or oxygen atom; m is as defined in the formula (1); n is an integer of 1 to 10; $*^1$ denotes a site bound to E in the formula (1); and $*^2$ denotes a site bound to D in the formula (1).

11. The directed self-assembly lithography method according to claim 5, further comprising:
forming a prepattern on the base film on the first surface of the base film after providing the base film and before providing the directed self-assembling film,
wherein, in providing the directed self-assembling film, the directed self-assembling film is provided on a region in which the prepattern is not formed.

12. The directed self-assembly lithography method according to claim 5, wherein A in the formula (1) represents an organic group having 1 to 30 carbon atoms, and n is an integer of 1 to 10.

13. The directed self-assembly lithography method according to claim 5, wherein A in the formula (1) represents a group represented by formula (3):

(3)

wherein, in the formula (3), Q represents a polysiloxane structure having a valency of (m+n) and having 2 to 100 silicon atoms; T represents a divalent organic group having 1 to 30 carbon atoms that bonds to the silicon atom in Q at the carbon atom or oxygen atom; m and n are as defined in the formula (1); $*^1$ denotes a site bound to E in the formula (1); and $*^2$ denotes a site bound to D in the formula (1).

14. The directed self-assembly lithography method according to claim 12, wherein A in the formula (1) represents a group represented by formula (3):

(3)

wherein, in the formula (3), Q represents a polysiloxane structure having a valency of (m+n) and having 2 to 100 silicon atoms; T represents a divalent organic group having 1 to 30 carbon atoms that bonds to the silicon atom in Q at the carbon atom or oxygen atom; m is as defined in the formula (1); n is an integer of 1 to 10; $*^1$ denotes a site bound to E in the formula (1); and $*^2$ denotes a site bound to D in the formula (1).

15. The directed self-assembly lithography method according to claim 4, further comprising:
forming a prepattern on the base film on the first surface of the base film after providing the base film and before providing the directed self-assembling film,
wherein, in providing the directed self-assembling film, the directed self-assembling film is provided on a region in which the prepattern is not formed.

16. The directed self-assembly lithography method according to claim 4, wherein A in the formula (1) represents an organic group having 1 to 30 carbon atoms, and n is an integer of 1 to 10.

* * * * *